US012451409B1

United States Patent
Lorenzi et al.

(10) Patent No.: US 12,451,409 B1
(45) Date of Patent: Oct. 21, 2025

(54) SEMICONDUCTOR AND OTHER ELECTRONIC DEVICES HAVING INTEGRATED COOLING SYSTEMS AND ASSOCIATED SYSTEMS AND METHODS

(71) Applicant: GemaTEG Inc., Bellevue, WA (US)

(72) Inventors: Bruno Lorenzi, Perugia (IT); Gianmarco Corbucci, Perugia (IT); Maurizio Miozza, Seattle, WA (US)

(73) Assignee: GemaTEG Inc., Bellevue, WA (US)

( * ) Notice: Subject to any disclaimer, the term of this patent is extended or adjusted under 35 U.S.C. 154(b) by 0 days.

(21) Appl. No.: 19/197,740

(22) Filed: May 2, 2025

Related U.S. Application Data

(63) Continuation-in-part of application No. 17/318,873, filed on May 12, 2021.

(60) Provisional application No. 63/023,774, filed on May 12, 2020.

(51) Int. Cl.
| | |
|---|---|
| *H01L 23/38* | (2006.01) |
| *H01L 25/065* | (2023.01) |
| *H01L 25/18* | (2023.01) |
| *H10B 80/00* | (2023.01) |

(52) U.S. Cl.
CPC .......... *H01L 23/38* (2013.01); *H01L 25/0657* (2013.01); *H01L 25/18* (2013.01); *H10B 80/00* (2023.02); *H01L 2225/06541* (2013.01); *H01L 2225/06589* (2013.01)

(58) Field of Classification Search
CPC ..... H01L 23/38; H01L 25/0657; H01L 25/18; H01L 2225/06541; H01L 2225/06589; H10B 80/00
See application file for complete search history.

(56) References Cited

U.S. PATENT DOCUMENTS

| | | |
|---|---|---|
| 3,786,168 A | 1/1974 | Jaecklin et al. |
| 5,269,146 A | 12/1993 | Kerner |
| 5,653,111 A | 8/1997 | Attey et al. |
| 5,711,155 A | 1/1998 | Devilbiss et al. |
| 5,918,469 A | 7/1999 | Cardella |
| 6,164,076 A | 12/2000 | Chu et al. |
| 6,191,546 B1 | 2/2001 | Bausch et al. |
| 6,289,678 B1 | 9/2001 | Pandolfi |
| 6,880,346 B1 | 4/2005 | Tseng et al. |
| 2004/0025516 A1 | 2/2004 | Van |
| 2004/0190251 A1 | 9/2004 | Prasher et al. |

(Continued)

*Primary Examiner* — Timor Karimy
(74) *Attorney, Agent, or Firm* — Perkins Coie LLP

(57) ABSTRACT

Semiconductor devices having integrated cooling systems, and associated systems and methods, are disclosed herein. An example of a semiconductor device according to the present technology is a system-in-package device that includes a base substrate, a processing device and a high-bandwidth memory device that are each integrated with the base substrate, and a package cooling device that is thermally coupled to the processing device and the high-bandwidth memory device. In some embodiments, the package cooling device includes a first heat spreader thermally coupled to an upper surface of the processing device, a second heat spreader thermally coupled to an upper surface of the high-bandwidth memory device, a thermoelectric cooling device positioned between and thermally coupled to a portion of the first heat spreader and the second heat spreader, and a heat exchanger thermally coupled to the first heat spreader.

14 Claims, 14 Drawing Sheets

(56) References Cited

U.S. PATENT DOCUMENTS

| | | |
|---|---|---|
| 2006/0005549 A1 | 1/2006 | Ishinabe et al. |
| 2006/0179849 A1 | 8/2006 | Abramov et al. |
| 2006/0185973 A1 | 8/2006 | Yazawa et al. |
| 2007/0034356 A1 | 2/2007 | Kenny et al. |
| 2008/0017367 A1 | 1/2008 | Yazawa et al. |
| 2009/0308081 A1 | 12/2009 | Ouyang et al. |
| 2010/0265986 A1 | 10/2010 | Mullin et al. |
| 2012/0024501 A1 | 2/2012 | Campbell et al. |
| 2013/0299145 A1 | 11/2013 | Lee et al. |
| 2014/0116670 A1 | 5/2014 | Kwak et al. |
| 2014/0260328 A1 | 9/2014 | Kubota |
| 2014/0305481 A1 | 10/2014 | Brandenburg et al. |
| 2014/0324399 A1 | 10/2014 | Barron et al. |
| 2015/0243870 A1 | 8/2015 | Kushch |
| 2016/0054065 A1 | 2/2016 | Nagai et al. |
| 2016/0087509 A1 | 3/2016 | Rippel et al. |
| 2017/0038805 A1 | 2/2017 | Chun |
| 2017/0278773 A1 | 9/2017 | Hwang et al. |
| 2017/0315595 A1 | 11/2017 | Kulkarni et al. |
| 2018/0031285 A1 | 2/2018 | Thomas et al. |
| 2018/0335231 A1 | 11/2018 | Gillen |
| 2023/0307318 A1* | 9/2023 | Lee .................... H01L 23/3128 |

\* cited by examiner

SEMICONDUCTOR AND OTHER ELECTRONIC DEVICES HAVING INTEGRATED COOLING SYSTEMS AND ASSOCIATED SYSTEMS AND METHODS

This application is a Continuation-In-Part of U.S. patent application Ser. No. 17/318,873, filed May 12, 2021, which claims priority to U.S. Provisional Application Ser. No. 63/023,774 filed May 12, 2020, the entireties of which are hereby incorporated herein by reference.

TECHNICAL FIELD

The present technology is generally directed to heat management for stacked semiconductor devices and, more specifically, to thermoelectric cooling systems for high-bandwidth memory devices and associated systems and methods.

BACKGROUND

An electronic apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM) and/or high-bandwidth memory (HBM), can utilize electrical energy to store and access data.

With technological advancements in embedded systems and increasing applications, the market is continuously looking for faster, more efficient, and smaller devices. To meet the market demands, semiconductor devices are being pushed to the limit with various improvements. Improving devices, generally, may include increasing circuit density, increasing circuit capacity, increasing operating speeds (or otherwise reducing operational latency), increasing reliability, increasing data retention, reducing power consumption, or reducing manufacturing costs, among other metrics. Attempts, however, to meet the market demands, such as by reducing the overall device footprint, can often introduce challenges in other aspects, such as maintaining circuit robustness and/or addressing increases in operating temperatures with increasing density. For example, the growth in complexity of microelectronics has introduced new challenges for thermal management. Multicore microprocessors provide unparalleled computing power for critical applications at an unprecedented thermal heat flux above 20 Watts per squared centimeter ($W/cm^2$). Similar considerations apply to power electronics and any other advanced field involving electronic systems.

Figure 1:
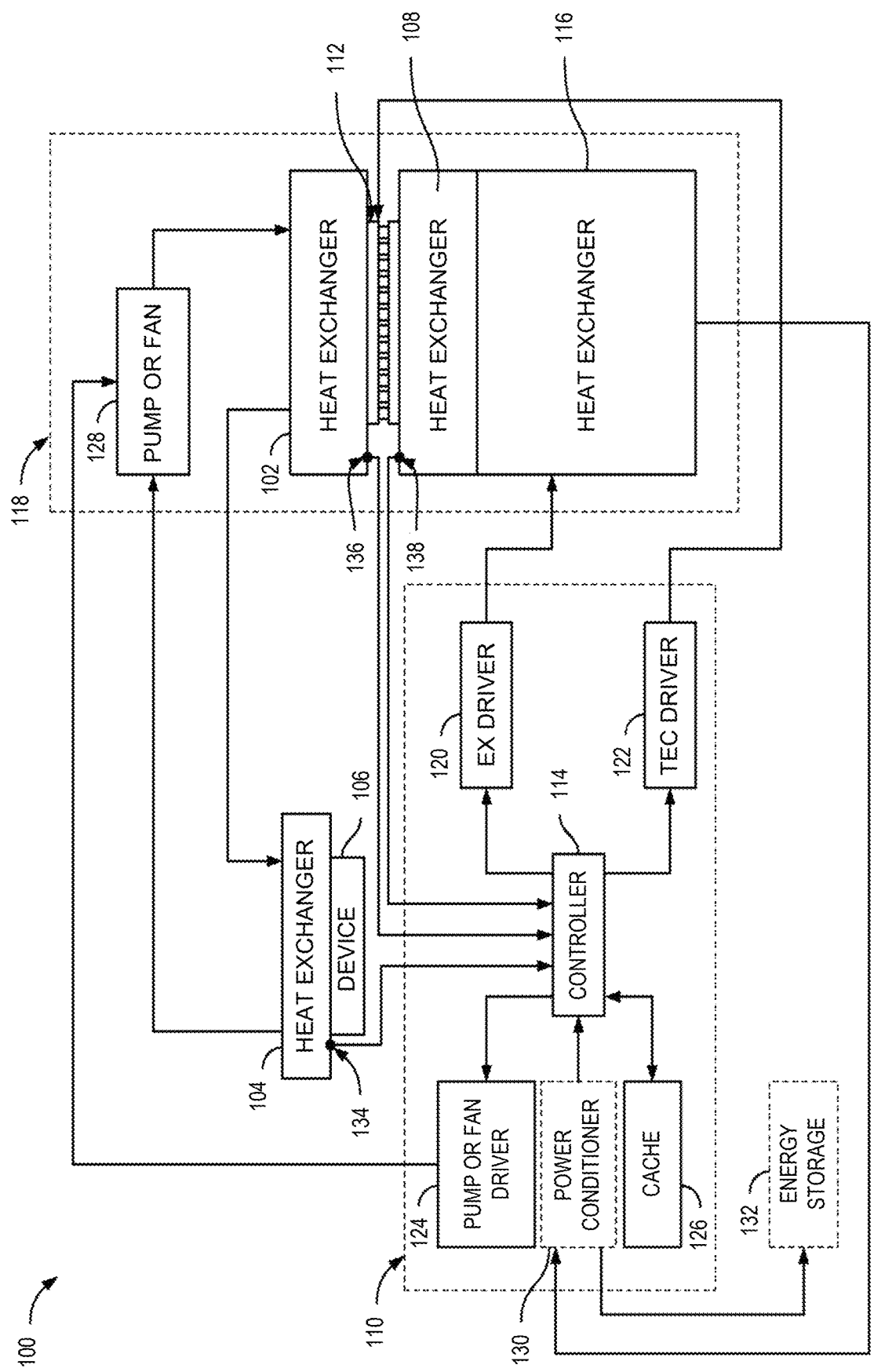
FIG. 1 is a schematic illustration of a system arranged in accordance with embodiments of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Introduction

Artificial intelligence (AI) and/or machine learning (ML) algorithms can place substantial computational loads on the electronic devices used to execute the algorithms. For example, system-in-package (SiP) devices (sometimes referred to herein as "electronic devices," "semiconductor devices," and/or the like) that include a processing device and one or more high-bandwidth memory (HBM) devices are often used to execute AI and/or ML algorithms because the HBM devices provide a relatively large amount of memory to the processing device via a high-bandwidth connection in the SiP device (e.g., a high-bandwidth bus in a silicon interposer). The AI and/or ML algorithms, however, place high computational loads on the processing device and the HBM devices (e.g., large numbers of read/write commands, large processing commands, and/or the like). The computational loads, in turn, result in significant generation of heat. As the heat builds up, the heat can cause memory dies in the HBM devices and/or caches in the processing device to require increased refresh rates. The increased refresh rates, in turn, can increase the power consumption of the SiP device and slow down the computations, thereby undermining the efficiency and/or computational power of the SiP device. Additionally, or alternatively, the heat can threaten damage to the HBM devices and/or the processing device. As a result, the SiP device can throttle the computing speed to help protect the HBM devices and/or the processing device, thereby further undermining the computational power of the SiP device.

Electronic devices that include integrated and peripheral cooling devices, and associated systems and methods are disclosed herein. In a specific example of the present technology, a SiP device can include a package cooling device thermally coupled to the processing device and the HBM devices in the SiP device. As discussed in more detail below, the package cooling device can include one or more thermoelectric cooling (TEC) devices (sometimes also referred to herein as "thermoelectric devices") positioned to provide active cooling to the processing device and/or one or more of the HBM devices. The integrated, active cooling can allow the package cooling device to actively remove heat from the components of the SiP device in response to the computational loads. By directly removing the heat from the SiP device, the package cooling device can help reduce heat build-up in the SiP device, thereby helping mitigate the deleterious effects discussed above. For example, the package cooling device can help keep the temperature in the SiP device below various thresholds to avoid increased refresh rates and/or throttling. As a result, the package cooling device can help increase the computational power and/or the efficiency of the SiP device. That is, the package cooling device can allow the SiP device to maintain processing speeds under high computational loads. As a result, for example, the package cooling device can help accelerate the speed of AI and/or ML algorithms executed by the SiP device. Additionally, or alternatively, the package cooling device can help extend the lifetime of the SiP device by reducing damage from heat buildup in the SiP device.

Additionally, or alternatively, the electronic devices disclosed herein can be coupled to various peripheral cooling devices. Purely by way of example, the package cooling devices disclosed herein can include a heat exchanger thermally coupled to the hot side of the TEC devices. The heat exchanger can include one or more fluid paths that allow a fluid (e.g., water, air, nitrogen, and/or the like) to be circulated through the heat exchanger and a peripheral cooling device. The peripheral cooling device, in turn, can include one or more TEC devices that extract heat from the fluid and direct a cooled fluid back to the package heat exchanger. That is, the peripheral cooling device can set the temperature of the fluid directed back to the heat exchanger in the package cooling device, thereby setting the temperature of the heat exchanger and/or the hot side of the TEC devices in the package cooling device. By directly controlling the input temperature, the peripheral cooling devices can help improve the heat that is removed from the SiP devices (and/or other suitable electronic devices).

The term "semiconductor device or die" generally refers to a solid-state device that includes one or more semiconductor materials. Examples of semiconductor devices include logic devices, memory devices, controllers, or microprocessors (e.g., central processing unit (CPU), graphics processing unit (GPU), accelerator processing unit (APU), neural processing unit (NPU), and/or the like), among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using one or more semiconductor manufacturing techniques. Materials can be deposited, for example, using chemical vapor deposition (CVD), physical vapor deposition (PVD), atomic layer deposition (ALD), spin coating, plating, and/or other suitable techniques. Similarly, materials can be removed, for example, using plasma etching, wet etching, chemical-mechanical planarization, or other suitable techniques.

High data reliability, high speed of memory access, lower power consumption, and reduced chip size are features that are demanded from semiconductor memory. In recent years, stacked memory devices (e.g., three-dimensional (3D) memory devices) have been introduced. Some stacked memory devices are formed by stacking memory dies vertically on a base die (e.g., a "2.5D memory device"), and interconnecting the dies using through-silicon (or through-substrate) vias (TSVs). Some stacked memory devices are formed by stacking memory dies vertically directly on a processing unit (e.g., "3D memory device") and interconnecting the dies using TSVs. Benefits of the stacked memory devices include shorter interconnects (which reduce circuit delays and power consumption), a large number of vertical vias between layers (which allow wide bandwidth buses between functional blocks, such as memory dies, in different layers), and a considerably smaller footprint. Thus, the 2.5D and 3D memory devices contribute to higher memory access speed, lower power consumption, and chip size reduction. Examples of stacked memory devices include Hybrid Memory Cube (HMC) and High-Bandwidth Memory (HBM). For example, HBM is a type of memory that includes a vertical stack of dynamic random-access memory (DRAM) dies and an interface die (which, e.g., provides the interface between the DRAM dies of the HBM device and a host device).

In a SiP device configuration, HBM devices may be integrated with a host device (e.g., a graphics processing unit (GPU), computer processing unit (CPU), accelerator processing unit (APU), neural processing unit (NPU), and/or another suitable processing unit) using a base substrate (e.g., a silicon interposer, a substrate of organic material, a substrate of inorganic material and/or any other suitable material that provides interconnection between the host device (e.g., the CPU/GPU/APU/NPU) and the HBM device and/or provides mechanical support for the components of a SiP device), through which the HBM devices and host communicate. Because traffic between the HBM devices and host device resides within the SiP (e.g., using signals routed through the silicon interposer), a higher bandwidth may be achieved between the HBM devices and host device than in conventional systems. In other words, the TSVs interconnecting DRAM dies within an HBM device (and the silicon interposer integrating HBM devices and a host device) enable the routing of a greater number of signals (e.g., wider data buses) than is typically found between packaged memory devices and a host device (e.g., through a printed circuit board (PCB)). The high-bandwidth interface within a SiP enables large amounts of data to move quickly between the host device (e.g., CPU/GPU/APU/NPU) and HBM devices during operation. For example, the high-bandwidth channels can be on the order of 1000s of gigabytes per second (GB/s, sometimes also referred to as gigabits (Gb)). It will be appreciated that such high-bandwidth data transfer between a CPU/GPU/APU/NPU and the memory of HBM devices can be advantageous in various high-performance computing applications, such as video rendering, high-resolution graphics applications, artificial intelligence and/or machine learning (AI/ML) computing systems and other complex computational systems, autonomous control of vehicles, and/or various other computing applications.

Thermoelectric devices offer various advantages for electronics thermal management, including reliability, compact envelope, fast response time, dual-purpose (e.g., cooling and power harvesting) and no moving parts. Thermoelectric modules generally refer to active devices that, once energized with electric power, act as a heat pump or, in the presence of a thermal gradient, harvest a portion of the heat flux and convert it into electrical energy. Conventional architectures, either with TEC on electronic devices or external, require higher electrical power to operate than traditional solutions, adding thermal load to the cooling system. Proper matching of the various elements introduces additional complexity to the overall architecture. Thus far, only low thermal load applications in niche sectors have benefited from the thermoelectric technology.

Examples of Suitable Peripheral Cooling Systems and Associated Systems and Methods In general, gas or liquid loop cooling systems with or without thermoelectric modules, extract the thermal energy and transfer it to the surrounding environment, which may occur without control on the transfer fluid properties. Their reliance on the heat exchanger cooling power causes the size to increase with the thermal heat flux.

Examples described herein include systems incorporating an integrated approach to thermoelectric architecture to address high thermal flux electronic devices in a compact design. Examples operate with single-phase liquids or gas, creating an opportunity for thermal management in environments where liquids are not allowed. Examples described herein may include a heat recovery system that may increase the overall efficiency with a high-performance microprocessor, application-specific integrated circuit (ASIC), GPU, CPU, APU, NPU, SiP device, and/or the like.

Accordingly, examples described herein may provide systems and methods for cooling of electronic devices. Examples may include a fluid cooling system (e.g., an active pre-cooling chamber), a heat exchanger, and a control system which may implement an adaptive control methodology. The fluid cooling system may establish the fluid parameters with a thermoelectric device to achieve desired (e.g., optimal) performance with a particular workload at particular boundary conditions. The heat exchanger may be compact and in direct contact with the electronic device. The heat exchanger may be designed to maximize heat transfer in a reduced envelope (e.g., in a 1U server slot). Control systems may be closed-loop and may implement an adaptive control methodology which may continuously adjust the thermoelectric device current and/or the fluid flow rate to the actual workload. Example systems may be suitable for high thermal load devices, work with various fluids, such as water and air, and operate in a reduced envelope (e.g., a 1U server slot). In some examples, a recovery system may be included that harvests a portion of the waste heat and converts it into electrical energy.

Examples of systems described herein may utilize a control strategy for a heat transfer fluid used to extract heat from an electronic device. A fluid cooling system may set fluid properties based on the actual thermal load, the boundary conditions, and the electronic device characteristics. The fluid cooling system may include a thermoelectric module and two heat exchangers to maintain a desired (e.g., optimal) thermal gradient between the thermoelectric device surfaces. A closed-loop control system may constantly regulate the thermoelectric current and a motor (e.g., a fan or pump motor using PWM (Pulse-Width Modulation)) to compensate for the electronic device's thermal load variations. The control system may identify and/or store the system parameters for use at various conditions, which may allow for a fast response time at multiple boundary conditions and avoid and/or reduce transient temperature spikes in the electronic device. The pre-conditioned fluid flows through the heat exchange device in thermal communication (e.g., close contact) with the electronic device. The heat exchange device may include one or more structures (e.g., a microchannel architecture) which may reduce and/or minimize the form factor and increase (e.g., achieve maximum) transfer power. The geometry and/or structures of the heat exchange device may be selected to increase the heat transfer coefficient at low flow rates, which may increase heat transfer to the fluid. The fluid flows back to the cooling system for re-conditioning Certain details are set forth herein to provide an understanding of described embodiments of technology. However, other examples may be practiced without various of these particular details. In some instances, well-known thermoelectric device components, fluid control components, circuits, control signals, timing protocols, and/or software operations have not been shown in detail in order to avoid unnecessarily obscuring the described embodiments. Other embodiments may be utilized, and other changes may be made, without departing from the spirit or scope of the subject matter presented here.

Examples of systems described herein have a flexible topology, with the fluid cooling systems located in proximity to the electronic device being cooled in some examples, such as in a compact design suitable for a 1U server. In some examples, the fluid cooling system may be located in a remote location, such as in case of other envelope constraints.

FIG. 1 is a schematic illustration of a system arranged in accordance with examples described herein. The system 100 is arranged to regulate a temperature of electronic device 106. The system 100 includes heat exchanger 104, temperature sensor 134, control system 110, and fluid cooling system 118. The fluid cooling system 118 may include pump or fan 128, heat exchanger 102, thermoelectric device 112, heat exchanger 108, heat exchanger 116, temperature sensor 136, and temperature sensor 138. The control system 110 may include controller 114, driver 124, driver 120, driver 122, and cache 126. In some examples, the control system 110 may include power conditioner 130. The power conditioner 130 may be coupled to energy storage 132. The components of FIG. 1 are exemplary. Additional, fewer, and/or different components may be included in other examples.

The heat exchanger 104 may be positioned to transfer heat from electronic device 106 into a fluid flowing through the heat exchanger 104. The fluid may flow from an output of the heat exchanger 104 to an input of heat exchanger 102. The pump or fan 128 may propel the fluid from the output of the heat exchanger 104 to the input of the heat exchanger 102. The heat exchanger 102 may cool the fluid, and cooled fluid may return from an output of the heat exchanger 102 to an input of the heat exchanger 104. In this manner, fluid may be remotely cooled using the fluid cooling system 118 and provided to the heat exchanger 104 to extract heat from the electronic device 106. In the fluid cooling system 118, the thermoelectric device 112 and heat exchanger 108 may be used to further control and/or regulate cooling of the fluid. In some examples, the heat exchanger 116 may further exhaust waste heat into an environment and/or capture heat for the generation of energy (e.g., power).

A control system 110 may be provided to provide closed-loop control of the fluid in the system 100. The temperature sensor 134 may measure a temperature of a portion of the heat exchanger 104 and/or electronic device 106. The temperature may be provided to controller 114. The temperature sensor 136 may measure a temperature of a portion of the heat exchanger 102. The temperature may be provided to controller 114. The temperature sensor 138 may measure a temperature of a portion of the heat exchanger 108. The temperature may be provided to controller 114. Controller 114 may be coupled to driver 120, driver 122, driver 124, and cache 126. The driver 120 may be coupled to the heat exchanger 116 to control operation of the heat exchanger 116. The driver 122 may be coupled to thermoelectric device 112 to control operation of the thermoelectric device 112. The driver 124 may be coupled to pump or fan 128 to control operation of pump or fan 128. The cache 126 may be coupled to the controller 114 and may store one or more values or software programs used by the power conditioner 130. In some examples, power conditioner 130 may be coupled to controller 114 and heat exchanger 116 and may be used to condition power generated by the heat exchanger 116. The power conditioner 130 may be coupled to energy storage 132 and may store some or all of the power or other energy generated by the heat exchanger 116 in the energy storage 132.

Examples of systems described herein accordingly may transfer heat from electronic devices, such as electronic device 106 of FIG. 1. Generally, heat may be transferred from any of a variety of electronic devices in accordance with techniques described herein. Examples of electronic devices include one or more central processing units (CPUs), graphics processing units (GPUs), accelerator processing units (APUs), neural processing units (NPUs), processors, servers, circuitry (e.g., one or more transistors, resistors, inductors), solid state drives, batteries, and/or memory devices. The electronic device may be included in an assembly (e.g., case, package, system, device). The temperature of the assembly may be used to provide fluid control in some examples. In some examples, electronic devices cooled herein may have a small form factor (e.g., below 50 cm2) and high heat flow (e.g., >10 W/cm2). Examples of electronic devices described herein may find use in a wide array of systems. For example, aeronautical or astronautical systems may utilize electronic devices. For example, one or more satellites may include high-power electronics for communications. Excess waste heat may influence navigation and/or adjacent equipment. Satellite electronics may be cooled using systems described herein. Automotive systems may utilize electronic devices. For example, one or more batteries included in electric vehicles may experience heating, such as during particular phase(s) of the duty cycle. Systems described herein may be used to cool automotive batteries in some examples. Communication systems may utilize electronic devices. For example, high-power microwave equipment such as radars may generate heat, in part due to low conversion efficiency of electrical energy to microwave energy. Microwave equipment, such as radar equipment, may be cooled using systems described herein.

A heat exchanger may be provided to transfer heat from an electronic device, such as the heat exchanger 104 of FIG. 1. The heat exchanger 104 may extract heat from the electronic device 106 primarily using convection in some examples. The heat exchanger 104 may be in thermal contact with the electronic device 106. For example, a surface of the heat exchanger 104 may be positioned such that heat from the electronic device 106 (e.g., from circuitry and/or any portion of an assembly enclosing circuitry) may be transferred to the heat exchanger 104. In some examples, the heat exchanger 104 may be in direct contact (e.g., direct physical contact) with the electronic device 106. The heat exchanger 104 may have a cavity through which a fluid may flow. The heat exchanger 104 may have an inlet for providing fluid into the cavity, and an outlet for fluid exiting the cavity (and/or exiting the heat exchanger 104). A flow rate of the fluid through the heat exchanger 104 may be set by a control system described herein. Heat may be transferred by convection from the electronic device 106 to a fluid partially or wholly filling a cavity of the heat exchanger 104.

Heat exchangers described herein, such as heat exchanger 104, may accordingly define a cavity through which fluid may flow. Heat exchangers, such as heat exchanger 104, may include one or more structures positioned wholly or partially in the cavity which may alter a flow of the fluid. In some examples, fluid flow may be altered by the structures to create one or more eddies in a flow the fluid. Examples of structures include microchannels, walls, pins, pillars, protrusions, depressions, or other alterations in a cavity which may affect a flow of a fluid through the cavity. Generally, a material of walls of the cavity and/or a material of the structures (e.g., of which the cavity and/or structures are formed or of which the cavity and/or structures are wholly or partially coated) may be selected to promote heat transfer between the fluid and the structures. For example, one or more metals may be used to form the cavity and/or structures. Examples include aluminum, copper, or nickel.

In this manner, a fluid may be heated by an electronic device. For example, a fluid in a cavity of heat exchanger 104 may be heated as heat is transferred through convection from electronic device 106. Examples of systems described herein may include a cooling system, such as fluid cooling system 118, which may transfer heat from the fluid. In some examples, accordingly, the fluid may be cooled after being heated by heat transfer from an electronic device. The cooling system (e.g., fluid cooling system 118) may be remote from the electronic device. For example, the fluid cooling system 118 may not be in thermal communication with the electronic device 106 and/or heat exchanger 104. One or more tubes, channels, ducts, or other fluid transfer devices may connect heat exchanger 104 with the fluid cooling system 118 to move fluid between the heat exchanger 104 and the fluid cooling system 118.

Accordingly, in systems described herein, fluid may be used to transfer heat from an electronic device. The fluid may accordingly be heated. A fluid cooling system may be used to cool the fluid. The cooled fluid may again be circulated to the heat exchanger used to extract heat from the electronic device. Examples of fluids described herein may include liquids, gasses, or combinations thereof. Examples of fluids include distilled water, solutions including nanoparticles, glycol mixture(s), and/or phase change materials. Fluid may be propelled through the system (e.g., heated fluid from the heat exchanger 104 to the fluid cooling system 118 and/or cooled fluid from the fluid cooling system 118 to the heat exchanger 104) using a pump and/or a fan, such as pump or fan 128. Examples of liquids which may be used include, but are not limited to water. Examples of gasses which may be used include, but are not limited to, air, oxygen, nitrogen. In some examples, geometries of the heat exchanger 104, heat exchanger 102, and/or electronic device 106 may be selected based on the type of fluid (e.g., liquid or gas) being used.

Accordingly, systems described herein may generally include one or more pumps and/or one or more fans. For example, the pump or fan 128 of FIG. 1 may be used. While the pump or fan 128 is depicted as part of fluid cooling system 118, in some examples, the pump or fan 128 may be coupled to the heat exchanger 104 and the fluid cooling system 118. Generally, pump or fan 128 is used to circulate fluid from the heat exchanger 104 to the fluid cooling system 118 and back. Generally, in examples where the fluid is or includes a liquid, a pump may be used to implement pump or fan 128. In examples where the fluid is or includes a gas, a fan may be used to implement pump or fan 128. Note that in some examples pump or fan 128 is positioned on a path where heated fluid is being transferred from the heat exchanger 104 to the fluid cooling system 118. By positioning the pump or fan 128 in the path of the heated fluid (rather than in the path where cooled fluid is passed from the fluid cooling system 118 to the heat exchanger 104), the impact of possible heat or losses imposed by the pump or fan 128 may be reduced and/or avoided. For example, in such a configuration, waste heat from the pump or fan may have a lesser effect on the fluid in the heat exchanger 104. The pump or fan 128, however, may nonetheless provide a propelling force that propels a fluid from heat exchanger 104 to fluid cooling system 118 and from fluid cooling system 118 back to heat exchanger 104. In some examples, the pump or fan 128 may propel the fluid continuously from the fluid cooling system 118 to the heat exchanger 104 and back. In some examples, the pump or fan 128 may propel the fluid intermittently (e.g., pulsatile or other periodic flow may be used). The pump or fan 128 may include a motor. A speed of the motor may set a flow rate of the fluid in some examples. The motor may be controlled using pulse width modulation (PWM). Accordingly, the control system 110 may provide one or more PWM signals to the pump or fan 128.

Examples of systems described herein may include a fluid cooling system to cool fluid used to extract heat from electronic devices. The fluid cooling system may set fluid properties based on the actual thermal load, the boundary conditions, and the electronic device characteristics. In the example of FIG. 1, fluid cooling system 118 may be positioned to receive heated fluid from an output of the heat exchanger 104, cool the fluid, and provide cooled fluid to an input of the heat exchanger 104. Fluid cooling systems may include one or more heat exchangers and thermoelectric devices. In the example of FIG. 1, the fluid cooling system 118 includes heat exchanger 102 coupled to thermoelectric device 112. The thermoelectric device 112 may be in turn coupled to heat exchanger 108. The heat exchanger 102 may be positioned to receive fluid from heat exchanger 104 (e.g., the heat exchanger 102 may be coupled to heat exchanger 104 using one or more fluid passageways and/or one or more pumps or fans. Heated fluid may accordingly be provided to an inlet of the heat exchanger 102. The fluid may enter a cavity of the heat exchanger 102. The heat exchanger 102 may cool the fluid. The heat exchanger 102 may cool the fluid at least partially using convection. As described herein with reference to heat exchanger 104, the heat exchanger 102 may in an analogous manner contain a cavity and one or more structures positioned wholly or partially in the cavity. The structures may affect a flow of the fluid in the cavity, such as by causing one or more eddies in the fluid flow. The heat exchanger 102 may cool the fluid, such as by extracting heat from the fluid due to convection and/or thermoelectric mechanisms. The fluid cooling system 118 may be proximate the electronic device 106 in some examples (e.g., in a 1U server slot and/or in a server slot in a same rack as the electronic device 106). In some examples, the fluid cooling system 118 may be remote from the electronic device 106 (e.g., in a different rack than the electronic device 106 and/or distanced from the electronic device 106 such as in another device, and/or spaced apart in a room or other location).

To aid in cooling fluid, heat exchangers of a fluid cooling system described herein may be coupled to (e.g., in thermal communication with) one or more thermoelectric devices. For example, the heat exchanger 102 may be coupled to (e.g., in thermal communication with) the thermoelectric device 112. A thermoelectric device generally refers to a device that may provide a thermal difference from one side to another responsive to an applied energy (e.g., an applied voltage and/or current). The thermoelectric device 112 may accordingly have a cold side and a hot side. The cold side generally refers to a portion of the device which may have a lower temperature than another side of the device having a higher temperature. The difference in temperature between the hot side and the cold side may be based on an applied power (e.g., voltage and/or current). In some examples, an applied thermoelectric current may be set by the control system 110. The difference in temperature between the hot side and the cold side may in some examples be influenced by heat transfer from other devices to the hot and/or cold sides as well. Once energized (e.g., powered), the thermoelectric device 112 may reduce a temperature of the fluid being circulated in the system, transferring the heat to the heat exchanger 108 and through the heat exchanger 116 to the environment in some example In some examples, electricity (e.g., power) may be generated in part due to a thermal difference between the hot and cold side of the thermoelectric device. For example, a thermoelectric device integrated in the heat exchanger 116 may be a thermoelectric generator used to generate electricity (e.g., power). In some examples, heat extracted from a fluid in heat exchanger 102 may be used to generate electricity by the thermoelectric device embedded in the heat exchanger 116. Generally, the thermoelectric device 112 may continue to be used for cooling of fluid, while another thermoelectric device integrated in heat exchanger 116 may perform heat recovery in some examples.

In the example of FIG. 1, the heat exchanger 102 may be coupled to (e.g., in thermal communication with) a cold side of the thermoelectric device 112. In this manner, heat may be extracted from heated fluid provided in and/or flowing through the heat exchanger 102. In some examples, another heat exchanger (e.g., heat exchanger 108 of FIG. 1) may be coupled to (e.g., in thermal communication with) the thermoelectric device, such as thermoelectric device 112. The heat exchanger 108 may be in thermal communication with the hot side of the thermoelectric device 112. As described herein with respect to heat exchangers, the heat exchanger 108 may have a cavity. A fluid may be present in and/or flowed through the cavity. One or more structures may be present in the cavity that may alter a flow of the fluid. In some examples, any fluid used in the heat exchanger 108 may be a different fluid than that circulated between heat exchanger 104 and fluid cooling system 118.

In some examples, the heat exchanger 102 and heat exchanger 108 have geometries and/or materials which may be selected for a thermal impedance match between the heat exchanger 102 and heat exchanger 108 and/or thermoelectric device 112. For example, a surface area of a side of the heat exchanger 108 facing the heat exchanger 102 may be selected to be equal to a surface area of a side of the heat exchanger 102 facing the heat exchanger 108. Generally, each component of the chain (e.g., heat exchanger 102, thermoelectric device 112, and heat exchanger 108) may have a specific thermal resistance ratio which may depend on the operating conditions and the configuration. For instance, based on the thermoelectric device 112 and its thermal resistance, the heat exchanger 102 and heat exchanger 108 may be provided with heat transfer coefficients which are equal and/or within a particular range and/or have a particular relationship with one another. This may facilitate heat flow in the system. Generally, the thermal resistance may depend on the geometry, flow rate, and heat load from the electronic device. Consider for a moment a parallel channel exchanger. The size of each channel determines at a specific flow rate the heat transfer coefficient (and/or its thermal resistance). The actual parameter is the hydraulic diameter, which may be equal to a ratio between area and surface of the channel section. Hydraulic diameter and flow rate combined may wholly or in part define the thermal resistance. In some examples, the geometry (e.g., hydraulic diameter) of the upper heat exchanger (e.g., heat exchanger 102) may be selected to be a fraction (e.g., half) of a value of the thermal resistance of thermoelectric device 112. Similar considerations apply to heat exchanger 108. Accordingly, the two heat exchangers, heat exchanger 102 and heat exchanger 108 may be used to maintain a desired (e.g., optimal) thermal gradient between the thermoelectric device 112 surfaces.

In some examples, thermoelectric device(s) in fluid cooling systems described herein may be operated wholly or partially as a generator. For example, using the Seebeck effect, the thermoelectric device embedded in the heat exchanger 116 may extract electrical power from heat. While commercial thermoelectric generator efficiency may be too modest, as the thermal gradient at the interfaces, to obtain substantial energy savings-however, some microprocessors present high heat flux. In some examples, such as examples where the electronic device 106 may be implemented using multiple microprocessors in one or more server racks, economy of scale may offset the generator's low efficiency.

In some examples, another heat exchanger, such as heat exchanger 116 of FIG. 1 may be coupled to the heat exchanger 108. The heat exchanger 116 may be used to exchange waste heat with the environment. In some examples, the heat exchanger 116 may provide electricity and/or energy generation based on the integrated thermoelectric generator. In some examples, an energy recovery system may be used to wholly and/or partially implement heat exchanger 116. The energy recovery system may include a thermoelectric generator that may convert all or portions of the heat flux from the heat exchanger 108 into electrical power. The amount of electrical power generated may depend on the thermal gradient between the thermoelectric generator's opposite surfaces and the heat load from the heat exchanger 108. In some examples, power conditioner 130 may transform the electrical power into signals and/or power suitable for storage in energy storage 132, such as a battery pack.

Systems described herein may include one or more temperature sensors. Temperature sensors may be provided to measure and/or monitor the temperature of certain components in the system. Components whose temperature may be monitored include an electronic device, one or more heat exchangers, the fluid, and/or the thermoelectric device or particular sides of the thermoelectric device. In the example of FIG. 1, the system 100 includes temperature sensor 134, temperature sensor 136, and temperature sensor 138. The temperature sensor 134 is positioned to measure a temperature of electronic device 106 and/or a side of the temperature sensor 134 facing the electronic device 106. The temperature sensor 136 is positioned to measure a temperature of a side of the heat exchanger 102 facing the thermoelectric device 112 (e.g., the cold side of the thermoelectric device 112). The temperature sensor 138 is positioned to measure a temperature of a side of the heat exchanger 108 facing the thermoelectric device 112 (e.g., the hot side of the thermoelectric device 112). Additional, fewer, and/or different temperature sensors may be used in other examples. In some examples, a temperature sensor may be positioned to measure a temperature of the fluid, for example at an input and/or output of heat exchanger 104 and/or heat exchanger 102.

Examples described herein may provide control of heat exchange using cooled fluids. For example, the rate of heat exchange and/or temperature of an electronic device, such as electronic device 106, may be controlled using control systems described herein. In some examples, the control system may set a flow rate of the fluid (e.g., by adjusting a motor speed) and/or may set a power to a thermoelectric device (e.g., by providing a particular thermoelectric current). The control system 110 may set an electric power to the thermoelectric device 112 and may set a flow rate of the pump or fan 128, taking into consideration the electronic device 106 characteristics, the temperature data from temperature sensor 134, temperature sensor 136, and/or temperature sensor 138, and/or the PWM duty cycle for the pump or fan 128 (e.g., as set by driver 124). In some examples, multiple temperature sensors may not be used. In some others only the temperature sensor 134 may be used as input to control system 110. In the example of FIG. 1, control system 110 includes controller 114, driver 124, driver 120, driver 122, and cache 126. Control systems may include one or more controllers, such as controller 114. Controllers may be implemented using, for example, one or more processors, microcontrollers, controllers, and/or circuitry. In some examples, a controller, such as controller 114 may additionally or instead be implemented using software and/or firmware. For example, computer readable media (e.g., memory, storage, read only memory (ROM), random access memory (RAM), solid state drive (SSD), cache 126) may be encoded with instructions which, when executed by a controller (e.g., processor) may perform control methodologies described herein. In some examples, the control system 110 may store parameters (e.g., flow rate(s), driver signals, PWM settings, and/or thermoelectric current settings) for particular boundary conditions—e.g., for particular loads (such as particular electronic devices) and/or temperatures. The parameters may be stored, for example in cache 126 or other memory accessible to the controller 114. During operation, the controller 114 may in some examples look-up parameters for use by the driver 124 and/or other drivers based on a thermal load and/or boundary conditions of the system 100.

Drivers may be used by the control system to provide a control signal to and/or influence performance of particular components. For example, the driver 124 maybe coupled to the pump or fan 128. The controller 114 may provide control signal(s) to driver 124, and the driver 124 may accordingly provide a signal to the pump or fan 128 to control operation of the pump or fan 128 e.g., to start, stop, and/or moderate a speed of the pump or fan 128. Controlling operation of the pump or fan 128 generally results in control of a flow rate of a fluid flowing between the heat exchanger 104 to the heat exchanger 102 and/or back. In some examples, the driver 124 may provide a pulse width modulated (PWM) signal to control and/or set a speed of a motor included in the pump or fan 128.

The driver 122 may be coupled to the thermoelectric device 112. The controller 114 may provide control signal(s) to the driver 122, and the driver 122 may accordingly provide a signal to the thermoelectric device 112 to control operation of the thermoelectric device 112. For example, the control signal may increase and/or decrease a current applied to the thermoelectric device 112 (and/or a voltage applied across the thermoelectric device 112), and may accordingly change a temperature difference between the hot and cold side of the thermoelectric device 112.

The driver 120 may be coupled to the heat exchanger 116. The controller 114 may provide control signal(s) to the driver 120. The driver 120 may in turn provide a signal to the heat exchanger 116 to set and/or change a rate of heat transfer to the environment. In some examples, the driver 120 may provide a signal to the heat exchanger 116 that may start, stop, and/or change a rate of electricity generation.

Accordingly, to provide control of heat exchange in the system, the controller 114 may receive one or more temperature signals from or proximate components of the system. For example, the controller 114 may receive a signal indicative of a temperature of an electronic device and/or a heat exchanger in thermal communication with the electronic device (e.g., from temperature sensor 134). In some examples, the controller 114 may additionally or instead receive signal(s) indicative of a temperature of one or more components of a fluid cooling system (e.g., of heat exchanger 102 and/or heat exchanger 108, such as from temperature sensor 136 and/or temperature sensor 138).

In this manner, control systems described herein may receive a signal indicative of a temperature of an electronic device. For example, the control system 110 may receive a signal indicative of a temperature of electronic device 106, such as a temperature from temperature sensor 134. The control system 110 (e.g., using controller 114) may compare the temperature to a desired temperature of the electronic device 106. The desired temperature may be stored in a memory or other electronic storage accessible to controller 114 (e.g., cache 126). In some examples, the desired temperature may be represented by one or more threshold values (e.g., a desired high temperature, a desired low temperature, and/or a desired average temperature). Based on the comparison, the control system 110 may provide one or more control signals to components of the system 100 to adjust the temperature closer to the desired temperature and/or within one or more of the threshold values. For example, the control system 110 may provide control signals to the pump or fan 128 and/or to the thermoelectric device 112 which may result in changes to the flow rate of the fluid and/or in a heat transfer coefficient at the heat exchanger 104 and/or heat exchanger 102. In this manner, overall heat transfer in the system may be adjusted. In some examples, a fluid temperature (e.g., as determined by power to thermoelectric device 112) and flow rate selected by the control system 110 may be selected to increase (e.g., maximizes) the heat transfer coefficient in the heat exchanger 104 at the electronic device 106 thermal load. A case temperature as measured by temperature sensor 134 may be controlled to remain below critical values (e.g., threshold values) regardless of the operating condition of the electronic device 106.

In some examples, control signals provided by the control system 110 (e.g., by controller 114 and/or any drivers of control system 110) may be based on fluid boundary conditions in the heat exchanger 104. For example, fluid dynamics occurring in the heat exchanger 104 may affect heat transfer to the fluid. The structures present in a cavity defined by the heat exchanger 104 may, for example, generate eddies or other fluid patterns that may affect the heat transfer. The controller 114 may utilize the anticipated fluid pattern to determine one or more control signals. In some examples, control signals provided by the control system 110 may additionally or instead be based on a thermal load at the electronic device 106. As the thermal load increases, a temperature of the electronic device 106 may increase. Accordingly, the controller 114 may increase a flow rate of the fluid and/or increase power to the thermoelectric device 112 to transfer more heat from the electronic device 106. Accordingly, the control system 110 may adjust a heat transfer coefficient between the fluid and one or more heat exchangers in the system (e.g., by adjusting a flow rate of the fluid and/or power to the thermoelectric device 112).

Accordingly, during operation, the control system 110 may receive one or more temperature signals of components in the system 100. The control system 110 may adjust a flow rate of the fluid circulating between heat exchanger 104 and fluid cooling system 118 and/or a power to thermoelectric device 112 when the temperature signals indicate the system performance is outside one or more threshold values. The adjustment of the flow rate and/or power may modify a heat transfer coefficient of the heat exchanger 104 and/or heat exchanger 102 which may contain the fluid. The adjustment may be made by the controller 114 and/or one or more drivers such that the temperature of the electronic device 106 and/or another component of the system moves toward the one or more threshold temperature s (e.g., desired temperature).

In some examples, a particular performance setting of the system 100 and/or control system 110 may be activated when the temperature of one or more components (E.g., a temperature of the electronic device 106 and/or heat exchanger 102 and/or heat exchanger 104 and/or heat exchanger 108) exceeds an allowable threshold. For example, the performance setting may be indicative of a more extreme adjustment setting to be made by the controller 114 using the drivers when the temperature is beyond an allowable threshold. If the temperature remains outside of a particular threshold range and/or exceeds an allowable threshold (either high or low) for greater than a particular amount of time (e.g., an amount of time stored in an area accessible to the controller 114, such as cache 126), the control system 110 may trigger an alarm. The alarm may be an audible, tactile, visual alarm and/or may include a communication (e.g., an email, phone call, text, SMS message, etc.). The controller 114 may trigger and provide the alarm, such as by providing an alarm signal to one or more displays, communication interface(s), speakers, and/or other output device(s) in communication with the controller 114 and/or control system 110.

Systems described herein may include one or more power generation and/or storage functionalities. For example, the heat exchanger 116 may generate electricity, for example based on integrated thermoelectric device. The control system 110 may in some examples include one or more power conditioners, such as power conditioner 130. The power conditioner 130 may be implemented, for example, using circuitry or other devices to condition power generated from the heat exchanger 116 and/or the embedded thermoelectric device. The controller 114 may provide one or more control signals to aid in conditioning the power. In some examples, the power conditioner 130 may provide signals to the controller 114 to maximize power generation. The power conditioner 130 may provide power to one or more energy storage devices, such as energy storage 132. The energy storage 132 may be implemented using, for example, one or more batteries.

Figure 2:
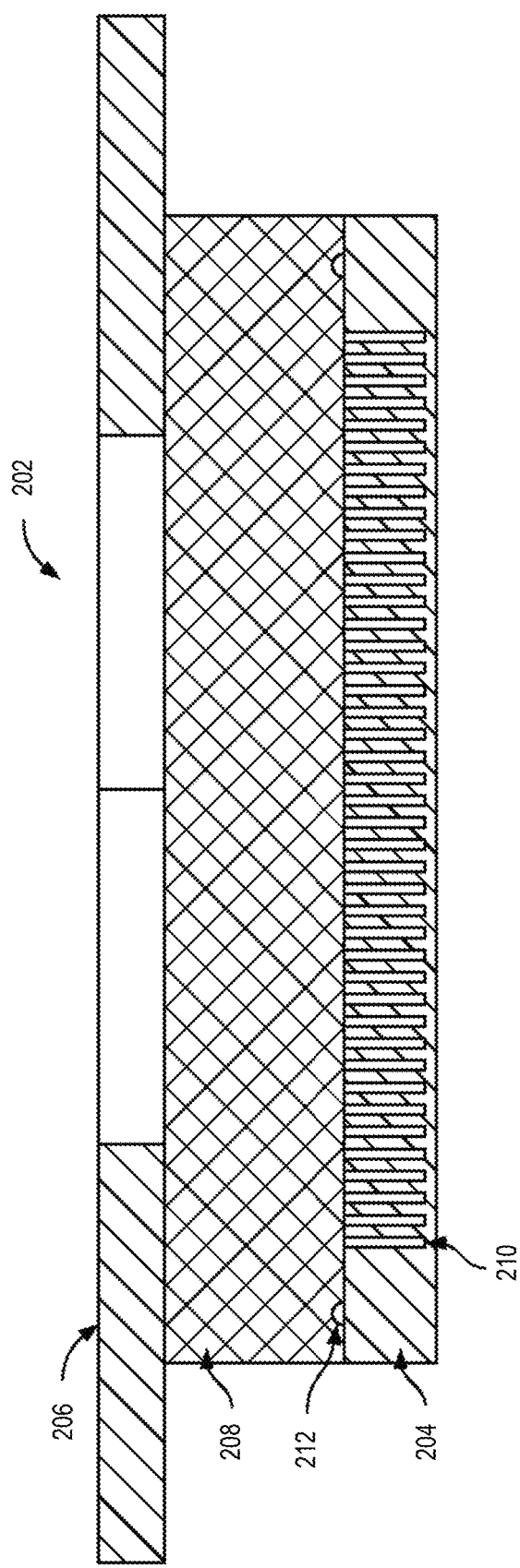
FIG. 2 is a schematic illustration of a cross-sectional view of a heat exchanger arranged in accordance with embodiments of the present technology.

FIG. 2 is a schematic illustration of a cross-sectional view of a heat exchanger arranged in accordance with examples described herein. The heat exchanger 202 includes radiator block 204, cover plate 206, and insulating body 208. The radiator block 204 includes microchannels 210. An interface between insulating body 208 and radiator block 204 may be sealed using seal 212. The heat exchanger 202 may be used to implement and/or may be implemented by the heat exchanger 102, heat exchanger 104, and/or heat exchanger 108 of FIG. 1 in some examples. The components shown in FIG. 2 are exemplary only. Additional, fewer, and/or different components may be used in other examples.

The radiator block 204 at least partially defines a cavity that fluid may flow within. In the example of FIG. 2, a cross-section of microchannels is shown, although other structures may be used. The microchannel architecture may be advantageous due to the wide range of operating conditions, high thermal loads, and limited envelope, which may be presented by an electronic device to be cooled in accordance with examples described herein. In the microchannel architecture, overall surfaces may overlap standard microelectronic surfaces (e.g., 40×40 mm and higher). The structures (e.g., microchannels 210) may be formed and/or coated with high thermal conductivity material (e.g., thermal compound or pads). The section of FIG. 2 shows equally spaced straight channels. The microchannels may have sub-millimetric spacing in some examples. The use of microchannels (or other structures in other examples) may increase a surface area over which the fluid may transfer heat to the radiator block 204. Generally any microchannel geometries may be used, including straight, curved, intersecting, interrupted, and/or broken. Accordingly, the microchannel (or other structure) may be encapsulated in one or more thermally insulating layers A channel may be provided in insulating body 208 to accommodate a seal, such as seal 212. The seal 212 may be implemented using, for example an O-ring and/or a gasket. The seal 212 may reduce and/or prevent fluid leakage.

The cover plate 206 may secure the heat exchanger 202 to an electronic device to be cooled, such as electronic device 106 of FIG. 1.

Figure 3A:
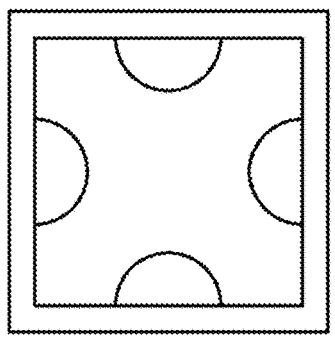
FIG. 3A and FIG. 3B are schematic cross-sections of example cavities in heat exchangers arranged in accordance with embodiments of the present technology.
Figure 3B:
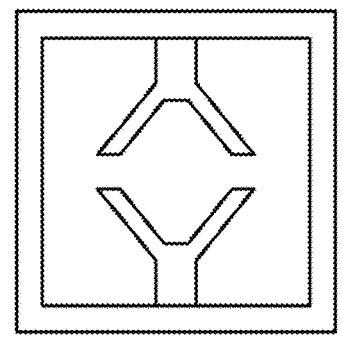

Examples of heat exchangers described herein may accordingly include one or more structures. The structures may alter the flow of the fluid within the cavity, such as by creating one or more eddies. Any of a variety of structures may be used. FIG. 3A and FIG. 3B are schematic cross-sections of example cavities in heat exchangers arranged in accordance with examples described herein. In the example of FIG. 3A, posts (e.g., pins) extending out from one or more walls of the cavity of a heat exchanger are provided. In the example of FIG. 3B, a V-shaped protrusion is provided extending out of at least one wall of the cavity, although more V-shaped protrusions from other walls may be used in other examples.

Figure 3C:
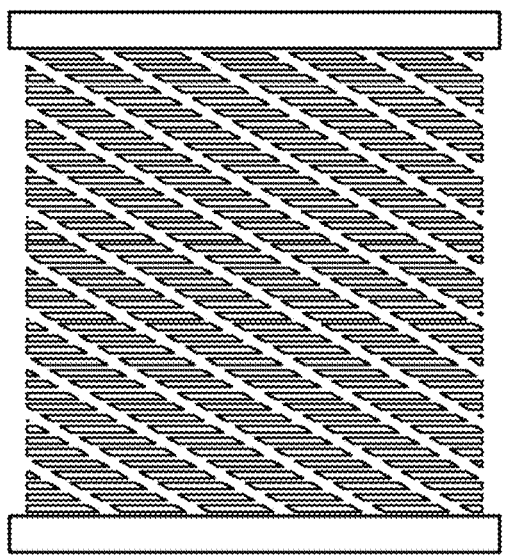
FIGS. 3C-3E are schematic top-down views of example cavities in heat exchangers arranged in accordance with embodiments of the present technology.
Figure 3D:
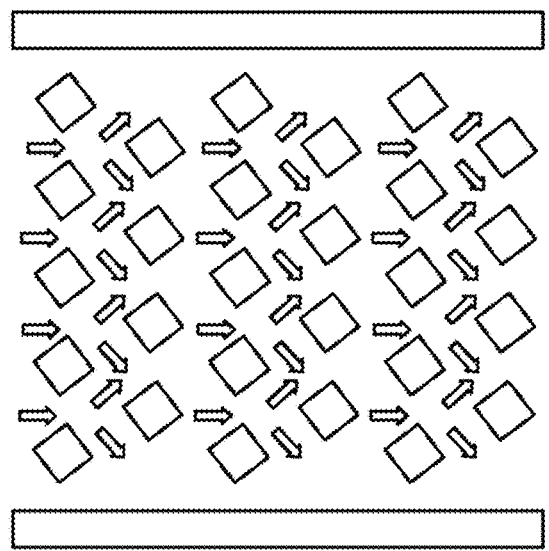
Figure 3E:
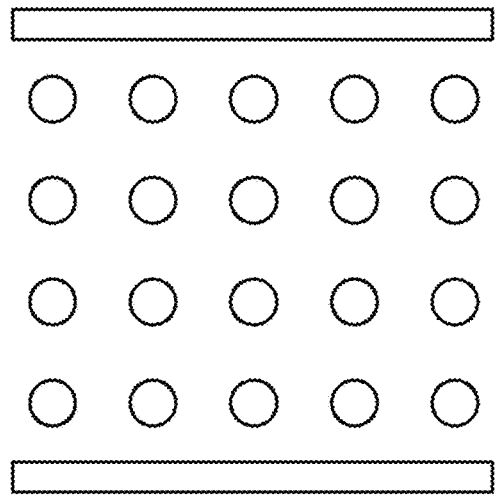

FIG. 3C-FIG. 3E are schematic top-down views of example cavities in heat exchangers arranged in accordance with examples described herein. FIG. 3C illustrates an arrangement of staggered lines of posts positioned within a cavity. FIG. 3D illustrates a shifted diamond shape posts positioned within a cavity, dividing fluid flow into multiple segments. FIG. 3E illustrates cylindrical pins within the cavity. Fluid flow may experience one or more eddies or other partially turbulent flow in the wide portions. Any of the examples of FIG. 3A-FIG. 3E may be used to implement heat exchangers described herein, such as heat exchanger 102, heat exchanger 104, and/or heat exchanger 108 of FIG. 1 in some examples.

It is to be understood that the arrangement, shape, and pattern of structures which may be disposed in the cavity may be quite flexible. Additionally, the wall shape of the various features may vary (e.g., may be straight and/or sloped). Generally, structures may be selected which may increase an amount of surface used to transfer heat from the device to the fluid and/or from the fluid to the device. However, the larger the surface, in some examples, the more friction the fluid may have at the channel walls. The fluid may then be slower, and the heat transfer process may become less efficient. Geometry and fluid speed (e.g., flow rates) are used herein to control heat transfer. In some examples, a larger pump or fan may be selected to further increase flow rates, however that may not be desirable in some examples due in part to larger size and/or larger power consumption.

In some examples, to design a cavity with structures, one or more cavity designs may be tested in a given system (e.g., with a particular electronic device and/or heat exchangers, and/or cooling system), and a particular structure arrangement may be selected from the candidate structures and/or a new arrangement selected based on thermal load and flow rate(s) in the system. In some examples, the structures may generate eddies that may increase the heat transfer in a similar manner as heat transfer is increased in a turbulent flow regime, however flow in the cavity may remain in a laminar flow regime. The increased heat transfer may occur even with a smaller heat transfer surface in some examples.

Figure 4:
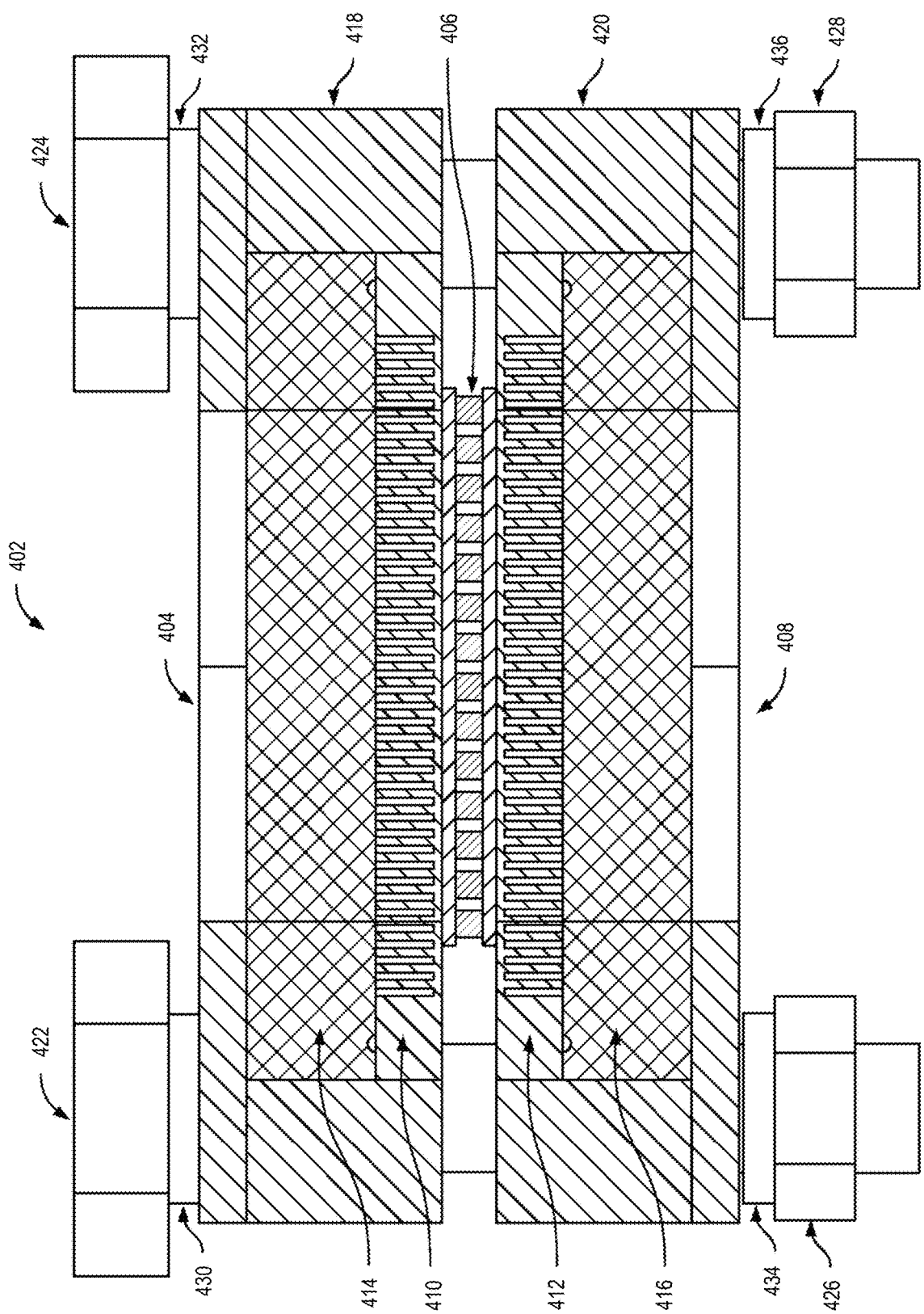
FIG. 4 is a schematic illustration of a cross-section of a fluid cooling system arranged in accordance with embodiments of the present technology.

FIG. 4 is a schematic illustration of a cross-section of a fluid cooling system arranged in accordance with examples described herein. The fluid cooling system 402 includes an upper heat exchanger 404, a thermoelectric device 406, and a lower heat exchanger 408. The fluid cooling system 402 may be used to implement and/or may be implemented by the fluid cooling system 118 of FIG. 1 in some examples. For example, the heat exchanger 404 may be used to implement and/or may be implemented by heat exchanger 102. The heat exchanger 408 may be used to implement and/or may be implemented by heat exchanger 108. The thermoelectric device 406 may be used to implement and/or may be implemented by thermoelectric device 112. Moreover, the heat exchanger 404 and/or heat exchanger 408 may be used to implement and/or may be implemented by the heat exchanger 202 of FIG. 2 in some examples. The components shown in FIG. 4 are exemplary only. Additional, fewer, and/or different components may be used in other examples.

The upper heat exchanger 404 and lower heat exchanger 408 may include radiator blocks. For example, the heat exchanger 404 may include radiator block 410 and the heat exchanger 408 may include radiator block 412. The radiator blocks may define a cavity for fluid flow, and may include one or more structures (e.g., microchannels). The radiator blocks may be encapsulated in one or more insulating layers. The heat exchanger 404 and heat exchanger 408 may include insulating bodies (e.g., one or more layers of insulating material). For example, the heat exchanger 404 may include insulating body 414. The heat exchanger 408 may include insulating body 416. The insulating body may generally be provided between a radiator block and a cover. The insulating body may be implemented using, for example, one or more insulating materials such as acrylic glass, glass. Another insulating body and/or layer may be used to form an outer body of the heat exchangers. For example, the heat exchanger 404 may include insulating body 418 and the heat exchanger 408 may include insulating body 420. Each element's geometry may be selected to provide (e.g., optimize) thermal impedance matching while in some examples reducing (e.g., minimizing) the envelope of the fluid cooling system 402 at maximum expected device electronic thermal load.

The fluid cooling system 402 may be assembled using a compression method, which may be an example of a mechanical locking mechanism. The thermoelectric device 406 may be coupled to the heat exchanger 404 and heat exchanger 408 using compression members. For example, bolt 422 may be secured to nut 426 and bolt 424 may be secured to nut 428 at opposite ends of the assembly. Other numbers of bolts and/or nuts may be used in other examples.

Washers or other separators may be used to isolate components and reduce and/or prevent thermal short circuits. For example, the washer 430 may be positioned between bolt 422 and heat exchanger 404. The washer 432 may be positioned between bolt 424 and heat exchanger 404. The washer 434 may be positioned between nut 426 and heat exchanger 408. The washer 436 may be positioned between nut 428 and heat exchanger 408. The washers may be implemented using thermally insulating washers in some examples.

Figure 5:
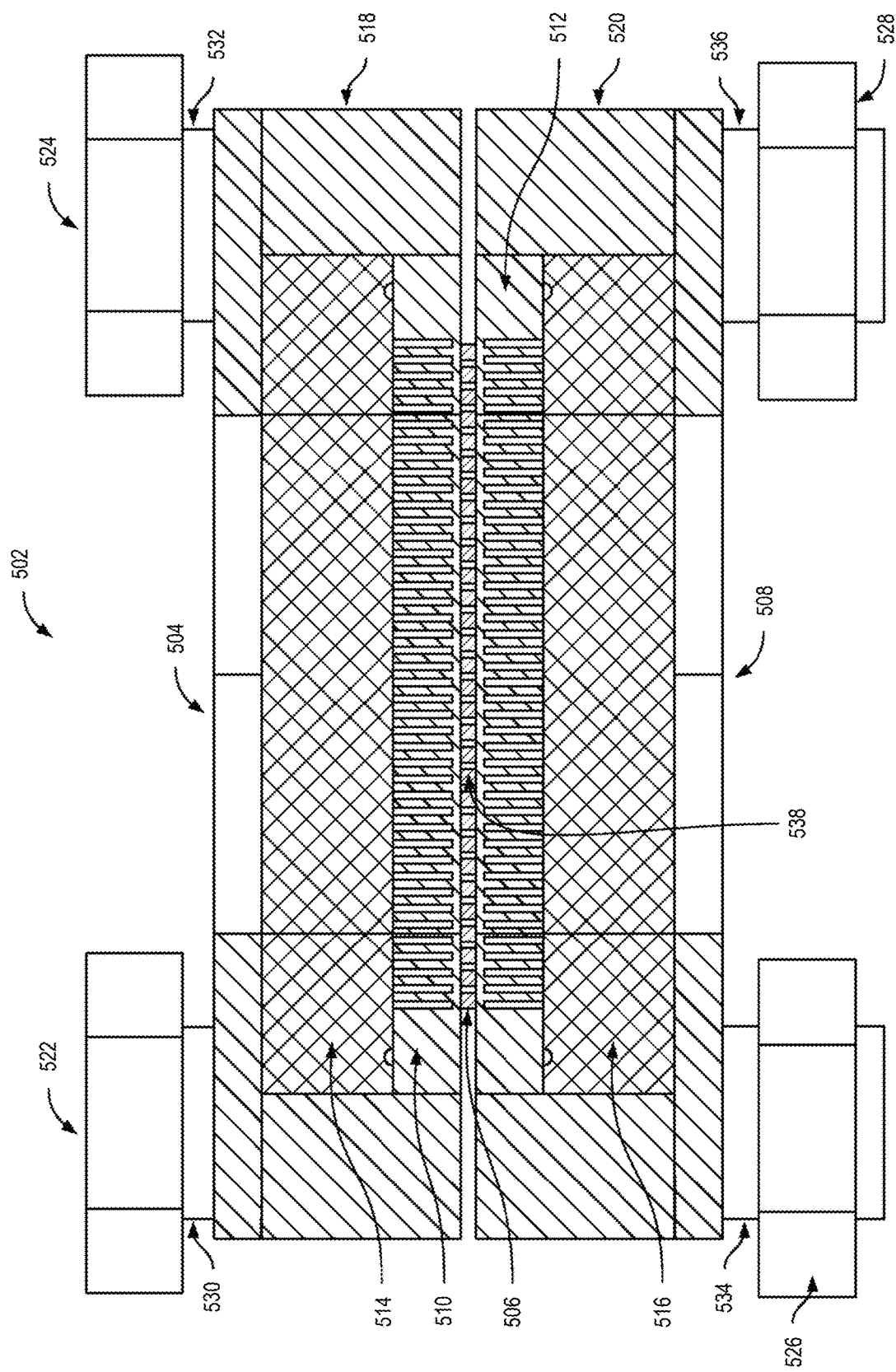
FIG. 5 is a schematic illustration of a cross-section of a fluid cooling system arranged in accordance with embodiments of the present technology.

FIG. 5 is a schematic illustration of a cross-section of a fluid cooling system arranged in accordance with examples described herein. The fluid cooling system 502 includes an upper heat exchanger 504, a thermoelectric device 506, and a lower heat exchanger 508. The fluid cooling system 502 may be used to implement and/or may be implemented by the fluid cooling system 118 of FIG. 1 in some examples. For example, the heat exchanger 504 may be used to implement and/or may be implemented by heat exchanger 102. The heat exchanger 508 may be used to implement and/or may be implemented by heat exchanger 108. The thermoelectric device 506 may be used to implement and/or may be implemented by thermoelectric device 112. Moreover, the heat exchanger 504 and/or heat exchanger 508 may be used to implement and/or may be implemented by the heat exchanger 202 of FIG. 2 in some examples. The components shown in FIG. 5 are exemplary only. Additional, fewer, and/or different components may be used in other examples.

The upper heat exchanger 504 and lower heat exchanger 508 may include radiator blocks. For example, the heat exchanger 504 may include radiator block 510 and the heat exchanger 508 may include radiator block 512. The radiator blocks may define a cavity for fluid flow, and may include one or more structures (e.g., microchannels). The heat exchanger 504 and heat exchanger 508 may include insulating bodies (e.g., one or more layers of insulating material). For example, the heat exchanger 504 may include insulating body 514. The heat exchanger 508 may include insulating body 516. The insulating body may generally be provided between a radiator block and a cover. The insulating body may be implemented using, for example, one or more insulating materials such as acrylic glass, glass. Another insulating body and/or layer may be used to form an outer body of the heat exchangers. For example, the heat exchanger 504 may include insulating body 518 and the heat exchanger 508 may include insulating body 520. Each element's geometry may be selected to provide (e.g., optimize) thermal impedance matching while in some examples reducing (e.g., minimizing) the envelope of the fluid cooling system 502 at maximum expected device electronic thermal load.

The fluid cooling system 502 may be assembled using a compression method, which may be an example of a mechanical locking mechanism. The thermoelectric device 506 may be coupled to the heat exchanger 504 and heat exchanger 508 using compression members. For example, bolt 522 may be secured to nut 526 and bolt 524 may be secured to nut 528 at opposite ends of the assembly. Other numbers of bolts and/or nuts may be used in other examples.

Washers or other separators may be used to isolate components and reduce and/or prevent thermal short circuits. For example, the washer 530 may be positioned between bolt 522 and heat exchanger 504. The washer 532 may be positioned between bolt 524 and heat exchanger 504. The washer 534 may be positioned between nut 526 and heat exchanger 508. The washer 536 may be positioned between nut 528 and heat exchanger 508. The washers may be implemented using thermally insulating washers in some examples.

In the example of FIG. 5, the radiator block 510 and radiator block 512 may integrate the thermoelectric elements 538 directly on and/or in the interface surface. In this manner, a thermoelectric device insulating layer may not be used between the thermoelectric device 506 and heat exchanger 504 and/or heat exchanger 508. The architecture may increase (e.g., optimize) thermal impedance matching and utilize a variety of thermoelectric materials.

Figure 6:
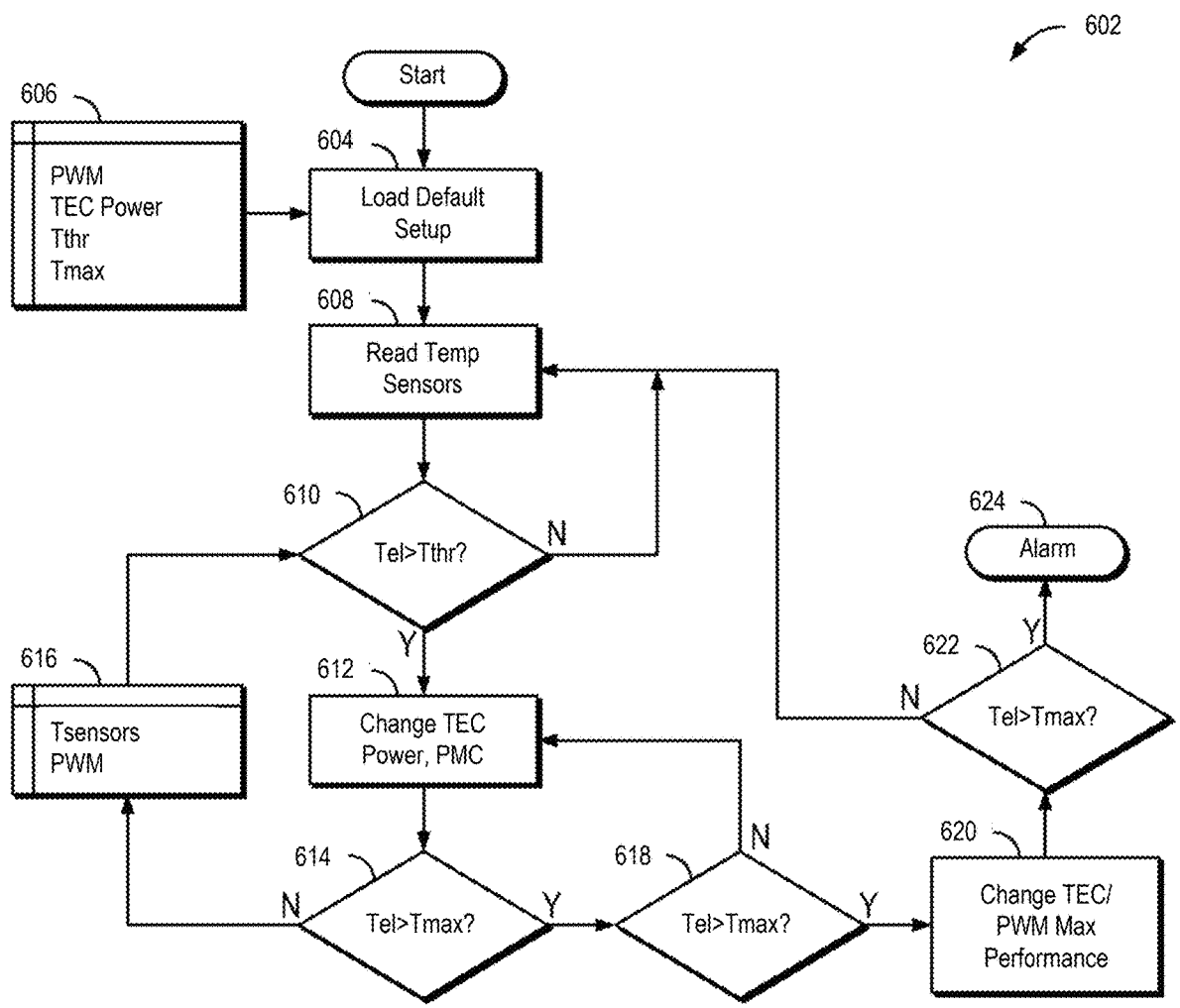
FIG. 6 is a flowchart illustrating an example control methodology arranged in accordance with embodiments of the present technology.

FIG. 6 is a flowchart illustrating an example control methodology arranged in accordance with examples described herein. The method shown in FIG. 6 may be implemented by one or more control systems described herein, such as control system 110 of FIG. 1 in some examples. For example, the control system 110 may include software (e.g., instructions encoded on one or more computer readable media) which may be executed by one or more processors (e.g., controller 114) to perform all or portions of the method shown in FIG. 6.

The method 602 may start in some examples in block 604. In block 604, a default setup may be loaded. For example, an initial thermoelectric power and/or motor control signal (e.g., PWM signal) may be loaded, e.g., from a memory accessible to controller 114 of FIG. 1, such as cache 126. Examples of data which may be stored, and which may be loaded in block 604 are shown as data 606. The data 606 may be stored in one or more memories, such as a memory accessible to the control system 110 (e.g., accessible to the controller 114 of FIG. 1). The data 606 includes PWM values (e.g., to control pump or fan 128). The data includes thermoelectric power (e.g., to control thermoelectric device 112 of FIG. 1). The data includes Tthr (e.g., a threshold temperature for initiating and/or stopping control). The data includes Tmax (e.g., a maximum allowable temperature). In some examples a calibration routine at first power-up of the system (e.g., of control system 110) may be used to define the initial parameters stored in the control system memory, such as one or more of the data 606.

In block 608, one or more temperature values may be read (e.g., received). For example, in the example of FIG. 1, the control system 110 (e.g., controller 114) may read and/or receive a temperature signal from temperature sensor 134.

The temperature signal from temperature sensor 134 may be indicative of a temperature of electronic device 106 (e.g., a temperature of a case of electronic device 106). Additionally or instead, in block 608 temperature readings from other components may be made and/or received. For example, temperature values may be read from temperature sensor 136 and/or temperature sensor 138 of FIG. 1. Block 608 may occur after block 604 in some examples. In some examples, block 608 may occur wholly or partially simultaneous with block 604, and/or before block 604.

A temperature of a component may be compared to a threshold temperature in block 610. For example, the control system 110 of FIG. 1 (e.g., the controller 114) may compare a temperature of the electronic device 106 with a threshold temperature. The threshold temperature, Tthr, may have been loaded in block 604 in some examples. The threshold temperature may be set by a user, may be changed in some examples during operation, and/or may be set at a time of initial operation or formation of the system 100. If the temperature rises above the threshold and/or is equal to the threshold in some examples, the control system may enter a trimming loop mode of operation.

In a trimming loop mode of operation, in block 612, a power signal to a thermoelectric device and/or a control signal to a fan or pump may be adjusted. For example, the control system 110 of FIG. 1 may adjust control signal(s) to the thermoelectric device 112 and/or pump or fan 128. For example, a thermoelectric current signal provided by driver 122 may be adjusted. Additionally or instead, a PWM signal provided by the driver 124 may be adjusted. The adjustments to the thermoelectric power (e.g., current) and/or the motor control signals may be made to increase heat transfer to the fluid in the heat exchanger 104 and/or increase heat transfer out of the fluid in heat exchanger 102. The temperature may continue to be compared to the threshold, such as in block 614. When the temperature has dropped below the threshold temperature, the parameter values 616 (e.g., motor control signals such as PWM signals, and/or thermoelectric power signals such as thermoelectric current signals or values) may be stored. For example the controller 114 of FIG. 1 may store parameter values used at a time that the temperature of electronic device 106 was less than the threshold temperature. The values may be stored in a memory accessible to controller 114, such as in cache 126.

If the temperature, however, does not fall below the threshold, but continues to be above the threshold and/or rises further, the temperature may be compared with a maximum temperature value in block 618. For example, the control system 110 (e.g., the controller 114) may conduct the comparison. If the temperature has not exceeded the maximum temperature, control signals may continue to be adjusted in block 612, for example in a continued effort to bring the temperature below the threshold temperature. However, if the temperature has exceeded the maximum temperature and/or exceeded the maximum temperature for longer than a threshold amount of time, parameter values for maximum cooling capacity may be selected in block 620. For example, the control system 110 of FIG. 1 (e.g., the controller 114) may load and/or access parameters corresponding to maximum cooling capacity from memory. The controller 114 may then communicate with the drivers to provide control signals corresponding to maximum cooling operation to the pump or fan 128 and/or thermoelectric device 112.

Following operation with maximum cooling operation parameter values, the temperature is compared again with the maximum threshold in block 622. For example, the control system 110 (e.g., controller 114) of FIG. 1 may conduct the comparison. If the temperature has fallen below the maximum temperature value, the method may return to block 608 where temperature values are taken and compared with the threshold value (e.g., by control system 110). If the temperature continues to exceed the maximum threshold, in some examples for longer than a threshold time, an alarm may be provided in block 624. The alarm may be visual, tactile, auditory, and/or may include a communication message (e.g., email, phone call, text message, SMS message). The alarm may be provided, for example by the control system 110 such as by controller 114 using one or more output device(s) in communication with controller 114.

In a particular example, it may be desired to maintain a particular electronic device (e.g., a CPU) below 70° C. That may correspond to a temperature value taken from a case of the CPU by the temperature sensor 134 of FIG. 1 below 50° C. As the temperature reading climbs, control system 110, such as using driver 124 may change a control signal to the pump or fan 128, such as by changing a PWM duty cycle (going, for instance, from 30% to 50% in some examples). Additionally or instead, the control system 110, such as using driver 122, may modify the current to the thermoelectric device 112 (for example, from 2 A to 6 A). Additional changes may occur to the PWM and/or current to the TEC until the temperature stabilizes. Similar considerations apply when the temperature at temperature sensor 134 is way below the threshold. The control system 110 may adjust the PWM and current to the TEC to save energy. In some examples, the sensors at the opposite sides of the thermoelectric device 112 (e.g., temperature sensor 136 and temperature sensor 138) may be used to adjust the cooling power. In some examples, changes to the control signals may be based on how fast the temperature of one or more components is changing.

Figure 7:
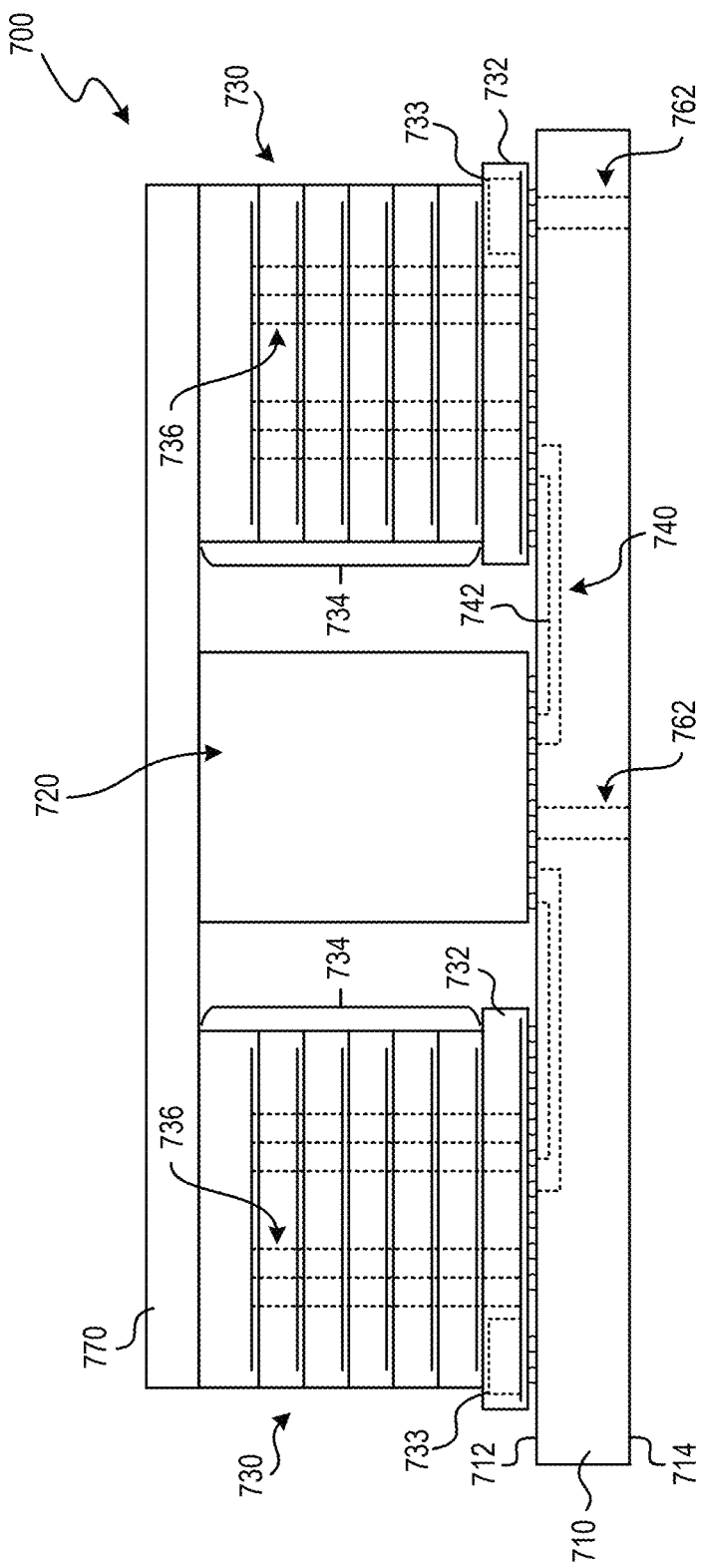
FIG. 7 is a partially schematic cross-sectional diagram of a system-in-package device having multiple high-bandwidth memory devices.

Examples of Suitable Integrated Cooling Systems and Associated Systems and Methods FIG. 7 is a partially schematic cross-sectional diagram of a SiP device 700 that can be deployed in various computing environments. As illustrated in FIG. 7, the SiP device 700 includes a base substrate 710 (e.g., a silicon interposer, another organic interposer, an inorganic interposer, and/or any other suitable base substrate), as well as a processing device 720 and one or more HBM devices 730 (two illustrated in FIG. 7) each integrated with an upper surface 712 of the base substrate 710.

The processing device 720 can be coupled to the HBM device 730 through a high-bandwidth bus 740 formed in the base substrate 710 (e.g., a substrate bus 742 portion) and each of the HBM devices 730 (e.g., an HBM bus portion). For example, the processing device 720 and the HBM devices 730 can each be coupled to various route lines in the substrate bus 742 via solder structures (e.g., solder balls), metal-metal bonds, and/or any other suitable conductive bonds. The route lines of the substrate bus 742, in turn, can include one or more metallization layers formed in one or more RDL layers of the base substrate 710 and/or one or more vias interconnecting the metallization layers. As a result, components of the HBM devices 730 and the processing device 720 can communicate data at a relatively high rate (e.g., on the order of 1000s of GB/s).

Further, as illustrated in FIG. 7, the base substrate 710 can include one or more external TSVs 762 (four illustrated in FIG. 7) that extend from the upper surface 712 of the base substrate 710 to a lower surface 714 of the base substrate 710. The external TSVs 762 can couple the processing device 720, the HBM device 730, and/or the substrate bus 742 to package interconnects (e.g., solder structures, bond pads, and/or the like) on the lower surface. In turn, the package interconnects can be coupled to an external substrate (e.g., a package substrate), thereby communicably coupling the processing device 720, the HBM device 730, and/or the substrate bus 742 to various external components.

In the environment illustrated in FIG. 7, the processing device 720 is illustrated as a single package/component. It will be understood, however, that the processing device 720 can include a variety of components, such as a processing unit (e.g., a CPU/GPU/APU/NPU), one or more registers, an L1 cache, an L2 cache, and/or any other suitable components (sometimes also referred to collectively herein as "a chiplet"). In contrast, FIG. 7 illustrates a variety of specific components of each of the HBM devices 730. For example, each of the HBM devices 730 includes a base die 732 and one or more memory dies 734 (six illustrated in FIG. 7) integrated with (e.g., carried by and electrically coupled to) the base die 732. The base die 732 (sometimes also referred to herein as an "interface die") includes a PHY 733 and one or more metallization layers communicably coupled to the PHY 733. Each of the memory dies 734 (e.g., DRAM dies) includes a plurality of TSVs 736 (and a plurality of bonding features such as metal-metal bonded pads, solder structures, and/or the like coupling the TSVs 736, sometimes referred to collectively as the "HBM bus") that establish a communication path between the base die 732 and each of the memory dies 734. As a result, the PHY 733 can route signals to (and receive signals from) each of the memory dies 734 through the HBM bus.

In an example of operation of the SiP device 700, the processing device 720 can request information stored in one or more of the HBM devices 730 through the substrate bus 742. The request is received by the PHY 733 of corresponding ones of the base dies 732. The PHY 733 then determines which of the memory dies 734 to request information from to satisfy the request from the processing device 720 (e.g., identifies which of the memory dies 734 stores the requested information). The PHY 733 then prompts the identified memory dies to forward the information via the HBM bus. The PHY 733 then receives the information (or an error signal) in response and forwards the information (or the error) back to the processing device 720. Operations according to the example above can share information at relatively high rates (e.g., up to an order of 1000s of GB/s), with each of the signals needing to be routed through the PHY 733. As a result, the PHY 733 can generate a substantial amount of heat. Unmitigated, the heat can elevate temperatures in the HBM device 730, thereby causing various deleterious effects in the HBM device 730, particularly within the memory dies 734. For example, the elevated temperatures can cause data loss in the memory dies 734, thereby requiring increased refresh rates to avoid errors. In turn, the increased refresh rates slow down overall processing in the SiP device 700 and increase power demands for the SiP device 700. That is, the heat from the PHY 733 can undermine the efficiency and/or processing speed of the SiP device 700. For complex computing operations, such as AI- and/or ML-related computations, the reduction in efficiency can significantly increase power demands and/or processing times (e.g., on the order of minutes to hours longer per command).

Still further, the processing device 720, after receiving information from the HBM devices 730, can also generate large amounts of heat. The heat generation can be especially high during complex computing operations, such as while running AI and/or ML algorithms, processing video data, and/or the like. Similar to the discussion above, the heat generation can cause deleterious effects in the SiP device 700. Purely by way of example, increases in heat can cause data loss in the caches of the processing device 720, thereby requiring increased refresh rates to avoid computational errors. The increased refresh rates, in turn, can further reduce the efficiency of the SiP (e.g., the processing speed and/or power requirements).

To help address these concerns, as further illustrated in FIG. 7, the SiP device 700 can include a thermal lid 770 that is carried by an uppermost surface of the processing device 720 and a topmost surface of each of the HBM devices 730 (e.g., an upper surface of an uppermost memory die). During operation, heat from the PHY 733 can be communicated through the memory dies 734 (e.g., via the TSVs 736) and into the thermal lid 770 (e.g., an integrated heat spreader) before being dissipated. Similarly, heat from the processing device 720 can be communicated into the thermal lid 770 before being dissipated.

As demands for the SiP device 700 increase, however, the number of the memory dies 734 (and therefore the distance between the PHY 733 and the thermal lid 770) and/or the computational loads on the processing device 720 are increased. The increases result in increases in heat generation (e.g., within the processing device 720 and/or the PHY 733), as well as decreases in heat dissipation due to the increased distance. As a result, the SiP device 700 can run back into the deleterious effects discussed above. As an alternative, or additional, mechanism for managing heat, the SiP device 700 can throttle operation of the processing device 720 and/or the HBM devices 730 to reduce the overall heat generation during complex computing operations. While throttling the operation can help avoid increases in energy consumption (e.g., based on increased refresh rates) and/or help avoid damage from thermal stress, the throttling can significantly slow down computations in the SiP device 700.

Figure 8:
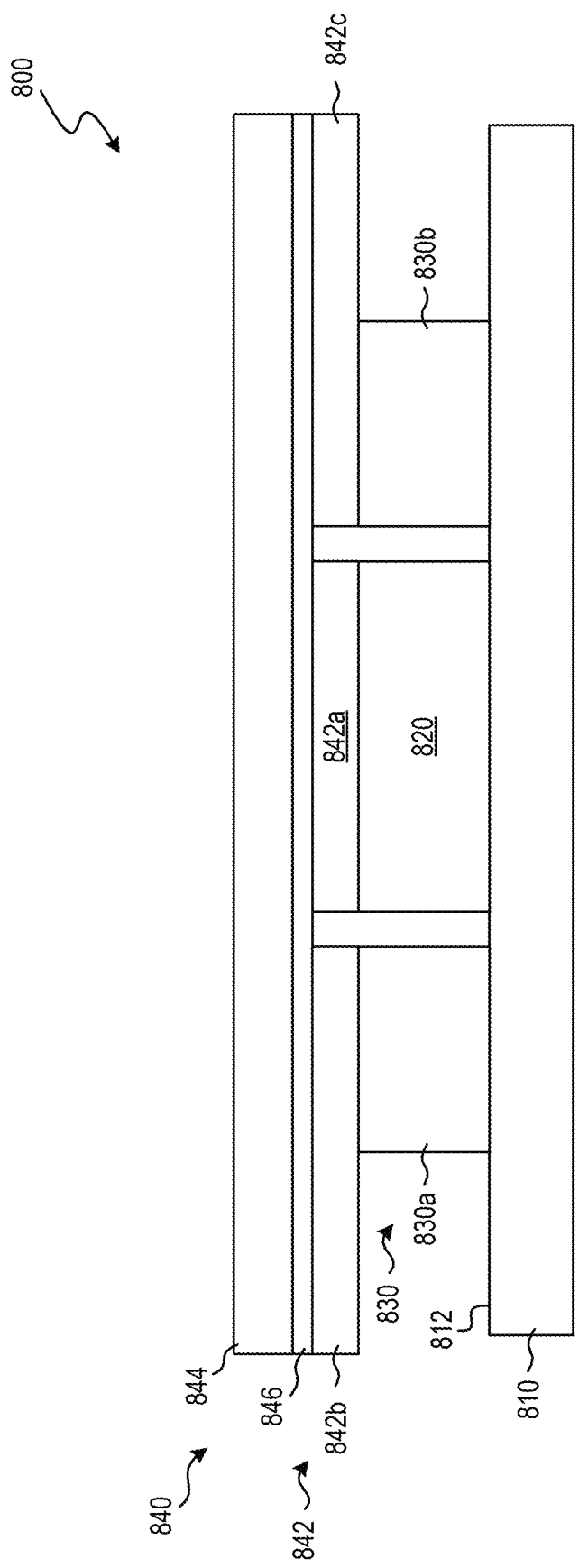
FIG. 8 is a partially schematic cross-sectional diagram of a system-in-package device configured in accordance with embodiments of the present technology.

SiP devices, and associated systems and methods, that incorporate thermoelectric cooling devices to control the temperature of individual components of the SiP devices (and/or other electronic devices) to address the challenges posed by heat generation discussed above are disclosed herein. As discussed in more detail below, the thermoelectric cooling devices can be generally similar to aspects of the thermoelectric cooling devices discussed above with reference to FIGS. 1-6, modified to be suitable for inclusion with a SiP device. Purely by way of example, FIG. 8 is a partially schematic cross-sectional diagram of a SiP device 800 configured in accordance with embodiments of the present technology. As illustrated in FIG. 8, the SiP device 800 is generally similar to the SiP device discussed above with reference to FIG. 7. For example, the SiP device 800 includes a base substrate 810, as well as a processing device 820 and one or more HBM devices 830 (two illustrated in FIG. 8) each integrated with an upper surface 812 of the base substrate 810.

Although the processing device 820 and the HBM devices 830 are illustrated as single components/packages in FIG. 8 for the sake of simplicity, it will be understood that the processing device 820 and the HBM devices 830 can include a variety of components. For example, similar to the discussion above, the processing device 820 can include a processing unit (e.g., a CPU/GPU/APU/NPU), one or more registers, an L1 cache, an L2 cache, and/or any other suitable components. In another example, similar to the discussion above, the HBM devices 830 can include a base die having a PHY as well as a stack of memory dies integrated with (e.g., carried by and coupled to) the base die.

As further illustrated in FIG. 8, however, the SiP device 800 further includes a package cooling device 840 carried by the processing device 820 and the HBM devices 830 (e.g., by the upper surfaces of the processing device 820 and the HBM devices 830). Further, the package cooling device 840 can include one or more TEC devices 842 (three illustrated in FIG. 8) thermally coupled to the processing device 820 and the HBM devices 830. Still further, each of the TEC devices 842 is thermally coupled to a heat exchanger 844 via a thermal layer 846 (e.g., a thermal paste, thermal spreader, and/or other suitable material). The TEC devices 842 can provide active cooling to the processing device 820 and the HBM devices 830 while rejecting heat into the heat exchanger 844. The heat exchanger 844, in turn, can absorb the heat and/or direct the heat into another rejection channel to control the temperature in the SiP device 800.

For example, as discussed in more detail below, the heat exchanger 844 can include one or more channels for a cooling medium (e.g., water, air, and/or another suitable fluid). The cooling medium can enter through an input at a first temperature, be circulated through the heat exchanger 844 to absorb heat from the heat exchanger 844, and then be expelled from an output at a second temperature. The cooling medium can then be cooled by various peripheral systems, such as additional heat exchangers and/or additional TEC devices. In a specific, non-limiting example, the heat exchanger 844 can be generally similar to the heat exchanger 104 discussed above with reference to FIG. 1. In this example, the fluid cooling system 118 discussed above set the first temperature of the cooling medium (i.e., the temperature at the input for the heat exchanger 844) via the systems and methods discussed above. In turn, the first temperature acts as the hot-side reference point for the package cooling device 840 (e.g., setting the hot side of the TEC devices 842). The TEC devices 842 can then provide an additional level of active cooling to the processing device 820 and the HBM devices 830 to help mitigate the deleterious effects of heat discussed above and to help increase an operational efficiency and/or computational power of the SiP device 800.

In the illustrated embodiments, the package cooling device 840 includes a first TEC device 842a is thermally coupled to an upper surface of the processing device 820, a second TEC device 842b is thermally coupled to an upper surface of a first HBM device 830a, and a third TEC device 842c is thermally coupled to an upper surface of a second HBM device 830b. The individualized thermal coupling can allow the package cooling device 840 to independently provide cooling to the processing device 820 and each of the HBM devices 830. Purely by way of example, a computing operation can require the processing device 820 to access information stored in the first HBM device 830a. In this example, the first and second TEC devices 842a, 842b can be operated to provide active cooling to the processing device 820 and the first HBM device 830a during the computing operation, thereby helping improve the efficiency and/or capacity of the SiP device 800 during the computing operation (e.g., increasing the speed of the computing operation and/or reducing the power demands during the computing operation), while the third TEC device 842c is not operated to reduce power consumption associated with cooling an inactive device.

Further, the first TEC device 842a can provide a different cooling power to the processing device 820 than the second TEC device 842b provides to the first HBM device 830a.

That is, the TEC devices 842 can maintain the processing device 820, the first HBM device 830a, and the second HBM device 830b at different operating temperatures. The differential cooling can help balance power consumption concerns against the deleterious effects of heat discussed above. For example, the memory dies in the HBM devices 830 can be more susceptible to heat than the components of the processing device 820. As a result, the HBM devices 830 must be kept at a cooler temperature than the processing device 820 to maintain a given processing speed (and/or given refresh rates in the processing device 820 and the HBM devices 830). As a result, the package cooling device 840 can operate the TEC devices 842 to provide more cooling to the first HBM device 830a than to the processing device 820 to maintain operating capacity (e.g., computational power) while reducing power consumption (e.g., as compared to the power associated with operating the first and second TEC devices 842a, 842b at the same rate).

In another, related example for the computing operation above, the first and second TEC devices 842a, 842b can be operated at a first rate while the third TEC device 842c is operated at a second rate lower than the first rate. The first rate can help actively cool the processing device 820 and the first HBM device 830a to maintain an operating capacity in the SiP device 800 for the active devices. The second rate can help keep the second HBM device 830b at a temperature ready for operation (e.g., providing enough cooling to remove heat leaking out of the processing device 820 and into the second HBM device 830b).

Figure 9:
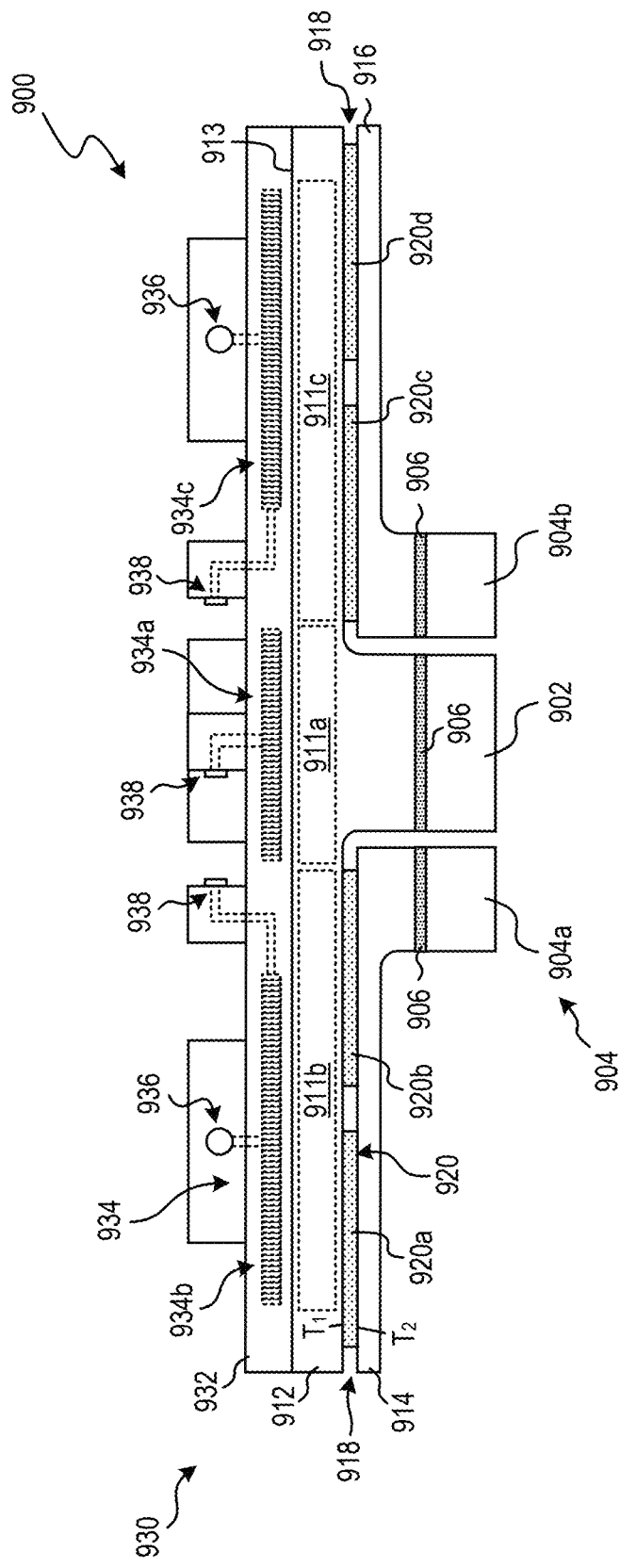
FIG. 9 is a partially schematic cross-sectional diagram illustrating additional details on a package cooling device in accordance with embodiments of the present technology.

FIG. 9 is a partially schematic cross-sectional diagram illustrating additional details on a package cooling device 900 configured in accordance with embodiments of the present technology. Similar to the embodiments discussed above with reference to FIG. 8, the package cooling device 900 can provide individualized cooling to a processing device 902 and one or more HBM devices 904 (two illustrated in FIG. 9, referred to individually as a first HBM device 904a and a second HBM device 904b). In the illustrated embodiments, the package cooling device 900 includes a first heat spreader 912, a second heat spreader 914, and a third heat spreader 916. The second heat spreader 914 is positioned at least partially (or fully) beneath the first heat spreader 912 and is spaced apart from the first heat spreader 912 by a gap 918. Said another way, the second heat spreader 914 can be partially (or fully) contained within a longitudinal footprint of the first heat spreader 912. Similarly, the third heat spreader 916 is positioned at least partially (or fully) beneath the first heat spreader 912 and is spaced apart from the first heat spreader 912 by a gap 918. Said another way, the third heat spreader 916 can be partially (or fully) contained within a footprint of the first heat spreader 912. Further, the third heat spreader 916 is positioned adjacent to an opposite side of the first heat spreader 912 as the second heat spreader 914. Still further, the package cooling device 900 can also include one or more TEC devices 920 (four illustrated in FIG. 9, referred to individually as first-fourth TEC devices 920a-920d) and a heat exchanger 930.

As further illustrated in FIG. 9, the first heat spreader 912 (sometimes also referred to herein as a "thermal spreader") has a T-shape and is thermally couplable to the processing device 902 (e.g., via thermal paste 906, another suitable thermal material, and/or direct contact). Similarly, the second heat spreader 914 has half of a T-shape and is thermally couplable to the first HBM device 904a and the third heat spreader 916 has half of a T-shape and is thermally couplable to the second HBM device 904b. In various embodiments, the first, second, and third heat spreaders 912, 914, 916 can include copper, aluminum, various metal composites (e.g., copper-tungsten, copper diamond, silver diamond, aluminum nitride, aluminum silicon carbide, and/or the like), various heat transfer devices such as vapor chambers and/or various ceramics, and/or the like to thermally couple the processing device 902 and the HBM devices 904 to various components of the package cooling device 900 for active cooling.

For example, the heat exchanger 930 is thermally coupled to an upper surface 913 of the first heat spreader 912 to absorb heat from the first heat spreader 912. As a result, the heat exchanger 930 can absorb heat from the processing device 902 via the first heat spreader 912. Similar to the discussion above with respect to the heat exchanger 844 of FIG. 8, the heat exchanger 930 can then help transport the heat away from the package cooling device 900. For example, as discussed in more detail below, the heat exchanger can include one or more travel paths for a cooling fluid to absorb heat from and carry heat away from the heat exchanger 930. As a result, the heat exchanger 930 can help actively transport heat away from the first heat spreader 912. In turn, similar to the discussion above with reference to FIGS. 1-6, the cooling fluid can be actively cooled peripherally to the package cooling device 900. As a result, the package cooling device 900, via the heat exchanger 930, can set a first temperature $T_1$ for the first heat spreader 912. Said another way, the heat exchanger 930 is configured to maintain the first heat spreader 912 at the first temperature $T_1$.

Further, the first and second TEC devices 920a, 920b are each positioned in the gap 918 between the first and second heat spreaders 912, 914 and thermally coupled to the first and second heat spreaders 912, 914. During operation, the first and second TEC devices 920a, 920b can create a temperature differential between the first heat spreader 912 and the second heat spreader 914. For example, when a drive current is applied to the first and second TEC devices 920a, 920b, the first and second TEC devices 920a, 920b can absorb heat from the first HBM device 904a via the second heat spreader 914 and expel the heat into the first heat spreader 912. In turn, as discussed above, the heat exchanger 930 can absorb heat from the first heat spreader 912. Said another way, the first and second TEC devices 920a, 920b can provide active cooling to the second heat spreader 914 to actively cool the first HBM device 904a while rejecting heat into the first heat spreader 912. The first heat spreader 912 can then communicate the rejected heat into the heat exchanger 930 to transport the heat away from the package cooling device 900.

Still further, the position of the first and second TEC devices 920a, 920b between the first heat spreader 912 and the second heat spreader 914 allows the first and second TEC devices 920a, 920b to cool the first HBM device 904a with respect to the processing device 902. For example, the first temperature $T_1$ in the first heat spreader 912 (e.g., set at least partially by the heat exchanger 930) is the temperature at the hot side of the first and second TEC devices 920a, 920b. During operation, the first and second TEC devices 920a, 920b set a second temperature $T_2$ at their cold side below the first temperature $T_1$. That is, the first and second TEC devices 920a, 920b set the temperature of the second heat spreader 914 below the temperature of the first heat spreader 912. In a specific, non-limiting example, the first temperature $T_1$ can be between about 40 degrees Celsius (° C.) and about 50° C., or about 45° C., while the second temperature $T_2$ is between about 30° C. and about 39° C., or about 35° C. In another specific, non-limiting example, the second temperature $T_2$ is between about 10° C. and about 30° C. colder than the first temperature $T_1$. Purely by way of example, when the first temperature $T_1$ is about 35° C., the second temperature $T_2$ can be between about 5° C. and about 25° C. The relative temperatures between the first and second heat spreaders 912, 914 can help the package cooling device 900 maintain the first HBM device 904a at a sufficiently low temperature to avoid the deleterious effects of heat discussed above. Further, the relative temperatures between the first and second heat spreaders 912, 914 can allow the package cooling device 900 to automatically keep the first HBM device 904a colder than the processing device 902 to help account for the higher sensitivity to heat in the first HBM device 904a (e.g., as compared to the processing device 902). That is, the package cooling device 900 can tailor the temperature of the first heat spreader 912 and the temperature of the second heat spreader 914 independent from each other. As a result, the package cooling device 900 can customize the amount of cooling provided to specific components of a SiP device (or other suitable electronic device). In turn, for example, the package cooling device 900 can provide only enough cooling to maintain the first HBM device 904a at a threshold temperature specific to the first HBM device 904a; and can provide only enough cooling power to maintain the and the processing device 902 at a threshold temperature specific to the processing device 902.

Still further, the relative temperatures between the first and second heat spreaders 912, 914 allows the package cooling device 900 to at least partially decouple the temperature of the first HBM device 904a from the temperature of the fluid loop. The decoupling can provide significant energy efficiency benefits for the package cooling device 900 (and/or the electronic device and/or system overall). For example, cooling enough water (or another suitable cooling fluid) to control the temperature of each component of the SiP device would be extremely energy intensive and/or impracticable as the demands for workload capabilities (e.g., as demands for Thermal Design Power (TDP) increase). By at least partially decoupling the second temperature $T_2$ from the temperature of the cooling fluid, the package cooling device 900 can maintain components of the SiP device at working temperatures to avoid throttling, thereby allowing the SiP device to meet increasing demands. Additionally, or alternatively, establishing a temperature differential between the cooling fluid (and/or the temperature in the first heat spreader 912) and the second heat spreader 914 can require less energy than cooling the cooling fluid (and/or an entire heat exchanger and/or spreader) to the cooler temperature in the differential. As a result, the decoupling can allow the package cooling device 900 to provide sufficient cooling to the SiP device to control the temperatures therein while consuming less power than a direct liquid cooling system. In yet another example, providing the cooling fluid at cold temperatures can generate condensation along each of the fluid lines. The condensation, in turn, must be managed to avoid damage to the SiP device (and/or the broader electronic system). By at least partially decoupling the second temperature $T_2$ from the temperature of the cooling fluid, the package cooling device 900 can reduce (or eliminate) the generation of condensation.

Similar to the first and second TEC devices 920a, 920b, the third and fourth TEC devices 920c, 920d are each positioned in the gap 918 between the first and third heat spreaders 912, 916. During operation, the third and fourth TEC devices 920c, 920d can create a temperature differential between the first heat spreader 912 and the third heat spreader 916. For example, when a drive current is applied to the third and fourth TEC devices 920c, 920d, the third and fourth TEC devices 920c, 920d can absorb heat from the third heat spreader 916 and expel the heat into the first heat spreader 912. That is, the third and fourth TEC devices 920c, 920d can provide active cooling to the third heat spreader 916, while rejecting heat into the first heat spreader 912. Further, similar to the discussion above, the first heat spreader 912 can then communicate the rejected heat into the heat exchanger 930 to transport the heat away from the package cooling device 900. Still further, the position of the third and fourth TEC devices 920c, 920d between the first heat spreader 912 and the third heat spreader 916 allows the third and fourth TEC devices 920c, 920d to cool the second HBM device 904b with respect to the processing device 902. For example, the first temperature $T_1$ in the first heat spreader 912 is the temperature at the hot side of the third and fourth TEC devices 920c, 920d. During operation, the third and fourth TEC devices 920c, 920d set a second temperature $T_2$ at their cold side below the first temperature $T_1$. As a result, the third and fourth TEC devices 920c, 920d set the temperature of the third heat spreader 916 below the temperature of the first heat spreader 912.

Although the first and second TEC devices 920a, 920b and the third and fourth TEC devices 920c, 920d have been discussed primarily in conjunction, it will be understood that the package cooling device 900 can operate each of the TEC devices 920 independently. For example, the package cooling device 900 can drive a current through the first TEC device 920a without driving a current through the second TEC device 920b to provide a smaller amount of active cooling to the second heat spreader 914 (and therefore the first HBM device 904a) than driving a current through both the first and second TEC devices 920a, 920b. In another example, the package cooling device 900 can drive a first current through the first and second TEC devices 920a, 920b and a second current through the third TEC device 920c to provide different amounts of cooling to the second and third heat spreaders 914, 916 (and the first and second HBM devices 904a, 904b, respectively). In yet another example, the package cooling device 900 can drive no current through any of the TEC devices 920 while running a cooling fluid through the heat exchanger 930 to provide cooling to the first heat spreader 912 (and the processing device 902) without cooling the first and second HBM devices 904a, 904b.

As a result, the package cooling device 900, and any controller coupled thereto, can customize the cooling provided to a SiP device (and therefore the temperature therein) based on various needs in the SiP device and/or goals for the operation. For example, the package cooling device 900 can ramp cooling up (or down) as a measured temperature in the SiP device (and/or specific components thereof) fluctuates. In another example, the package cooling device 900 can ramp cooling up (or down) as workloads in different components of the SiP device fluctuate (e.g., ramping cooling up in the first HBM device 904a during a data-heavy computation accessing data in the first HBM device 904a) to control the temperature in the different components of the SiP device. In yet another example, the amount of cooling can be based on the time-sensitivity of a computation (e.g., whether results are needed in real-time), energy consumption goals for the SiP device, temperature limits for components of the SiP device, and/or various other considerations. Each of the considerations can be based on predetermined settings and/or dynamically received settings. In a specific, non-limiting example, a first computation can require results in real time, irrespective of the energy consumption, while a second computation can require meeting an energy consumption target without constraints on timing. In this example, the package cooling device 900 can apply more cooling to the SiP device for the first computation than for the second computation. As a result, the package cooling device 900 can control the temperature of each component of the SiP device to maintain the temperature of each of the components at various selected temperatures. For example, the package cooling device 900 can maintain the temperature of each of the components below a component-specific temperature threshold that would reduce computational power (e.g., due to increased refresh rates, throttling, and/or the like) in the SiP. Said another way, the tailored operation can allow the package cooling device 900 to respond to component-specific conditions and/or computation-specific constraints. In a specific, non-limiting example, AI algorithms frequently include two main working conditions: training and inference. Training is computationally intensive such that the primary workload will be placed on the processing device (e.g., on the CPU/GPU/APU/NPU), such that the processing device is the primary source of heat. Inference, in contrast, will shift power consumption and workload more to the HBM devices, such that the HBM devices generate more heat. As a result, in this example, the package cooling device 900 can tailor operation to provide more cooling to the processing device during training, then to deliver more cooling power to the HBM devices during inference.

As further illustrated in FIG. 9, the heat exchanger 930 can include a main body 932 and one or more fluid paths 934 extending from an inlet 936 to an outlet 938. The main body 932 can include various conductive materials, such as copper, aluminum, knuckle, various metal composites (e.g., copper-tungsten, copper diamond, silver diamond, aluminum nitride, aluminum silicon carbide, and/or the like), and/or the like. The fluid paths 934 can be formed directly into the main body 932 to allow a fluid (e.g., water, liquid solutions, air, nitrogen gas, and/or the like) to flow through the main body 932 to absorb heat therefrom. The fluid can then exit the fluid paths 934 via the outlets 938 to be circulated through a variety of peripheral systems (e.g., the fluid cooling system 118 of FIG. 1, a reservoir, and/or) to remove heat from the fluid. New or cooled fluid can then be reintroduced to the fluid paths 934 via the inlets 936. In some embodiments, the incoming fluid is an adjustable, set temperature to control a temperature of the heat exchanger 930. In various embodiments, the fluid paths 934 can have any suitable configuration and/or orientation. Purely by way of example, the fluid paths 934 can have a serpentine travel path through the main body 932, any of the cavity configurations and/or features discussed above with reference to FIGS. 3A-3E, one or more fins, and/or the like. The different configurations can help balance fluid contact with the main body 932 (e.g., to support heat transfer between the main body 932 with the fluid) with resistance to flow (e.g., where higher resistance requires a stronger pump to move fluid through the fluid paths 934).

In the illustrated embodiments, the heat exchanger 930 includes three fluid paths 934 formed into the main body 932. More specifically, the heat exchanger 930 includes a first fluid path 934a positioned over a first portion 911a of the first heat spreader 912; a second fluid path 934b positioned over a second portion 911b of the first heat spreader 912; and a third fluid path 934c positioned over a third portion 911c of the first heat spreader 912.

The first portion 911a (sometimes also referred to herein as a "central portion" of the first heat spreader and/or the like) is vertically aligned with the processing device 902 such that a direct thermal path from the processing device 902 to the heat exchanger 930 passes through the first portion 911*a*. As a result, fluid passed through the first fluid path 934*a* can more directly help remove heat from the processing device 902 than fluid in the second and third fluid paths 934*b*, 934*c*. In turn, the package cooling device 900 (or another suitable controller) can control the temperature of the fluid coming into the first fluid path 934*a* and/or a speed of the fluid in the first fluid path 934*a* to help adjust the amount and/or rate of heat transportation away from the processing device 902 (e.g., to control the heat flux through the first fluid path 934*a*). Said another way, the package cooling device 900 can control various operating parameters associated with the first fluid path 934*a* to help control the temperature of the processing device 902. The control can, in turn, allow the package cooling device 900 to help balance increasing the efficiency of the processing device 902 (e.g., reducing refresh rates, lowering power consumption, and/or the like) with overall power demands for the SiP device.

Similarly, the second portion 911*b* (sometimes also referred to herein as a "peripheral portion" of the first heat spreader 912 that is adjacent to a first side of the central portion) is vertically aligned with the first and second TEC devices 920*a*, 920*b* and the second heat spreader 914. Thus, a direct thermal path from the first HBM device 904*a* to the heat exchanger 930 passes through the second portion 911*b*. As a result, similar to the discussion above, fluid passed through the second fluid path 934*b* can more directly help remove heat from the first HBM device 904*a* than fluid in the first and third fluid paths 934*a*, 934*c*. Therefore, the package cooling device 900 can control various operating parameters associated with the second fluid path 934*b* (e.g., incoming fluid temperature, flow rate, and/or the like) to help control the temperature of hot side of the first and second TEC devices 920*a*, 920*b*, and therefore the cooling provided to the first HBM device 904*a* and/or the resulting operating temperature of the first HBM device 904*a*. The control can, in turn, allow the package cooling device 900 to help balance increasing the efficiency of the first HBM device 904*a* (e.g., reducing refresh rates, lowering power consumption, and/or the like) with overall power demands for the SiP device.

Still further, the third portion 911*c* (sometimes also referred to herein as a "peripheral portion" of the first heat spreader 912 that is adjacent to a second side of the central portion) is vertically aligned with the third and fourth TEC devices 920*c*, 920*d* and the third heat spreader 916. Thus, a direct thermal path from the second HBM device 904*b* to the heat exchanger 930 passes through the third portion 911*c*. As a result, fluid passed through the third fluid path 934*c* can more directly help remove heat from the second HBM device 904*b* than fluid in the first and second fluid paths 934*a*, 934*b*. Therefore, the package cooling device 900 can control various operating parameters associated with the third fluid path 934*c* (e.g., incoming fluid temperature, flow rate, and/or the like) to help control the temperature of hot side of the third and fourth TEC devices 920*c*, 920*d*, and therefore the cooling provided to the second HBM device 904*b* and/or the resulting operating temperature of the second HBM device 904*b*. The control can, in turn, allow the package cooling device 900 to help balance increasing the efficiency of the second HBM device 904*b* (e.g., reducing refresh rates, lowering power consumption, and/or the like) with overall power demands for the SiP device.

In some embodiments, the operating parameters (e.g., temperature of the incoming fluid, flow rate, and/or the like) of the first, second, and third fluid paths 934*a*, 934*b*, 934*c* are fully independent from each other. For example, the package cooling device 900 (and/or another suitable controller) can deliver a first fluid to the first fluid path 934*a* at a first temperature and first flow rate; a second fluid to the second fluid path 934*b* at a second temperature and a second flow rate; and a third fluid to the third fluid path 934*c* at a third temperature and a third flow rate. The first, second, and third temperatures can all be different from each other. In a specific, non-limiting example, the second and third temperatures can be lower than the first temperature to remove additional heat from the second and third portions 911*b*, 911*c* of the first heat spreader 912 to help support operation of the TEC devices 920. Additionally, or alternatively, the first, second, and third flow rates can all be different from each other. The different flow rates can help support different heat fluxes through the first, second, and third portions 911*a*, 911*b*, 911*c* of the first heat spreader 912.

Although discussed primarily herein in the context of mitigating heat in a SiP device, it will be understood that the package cooling devices disclosed herein can be applied to various other electronic devices. For example, the package cooling devices disclosed herein can be applied to various other semiconductor devices and/or semiconductor packages, such as a stand-alone processing unit (e.g., a CPU, GPU, and/or the like), a stand-alone ASIC, and/or the like.

Figure 10A:
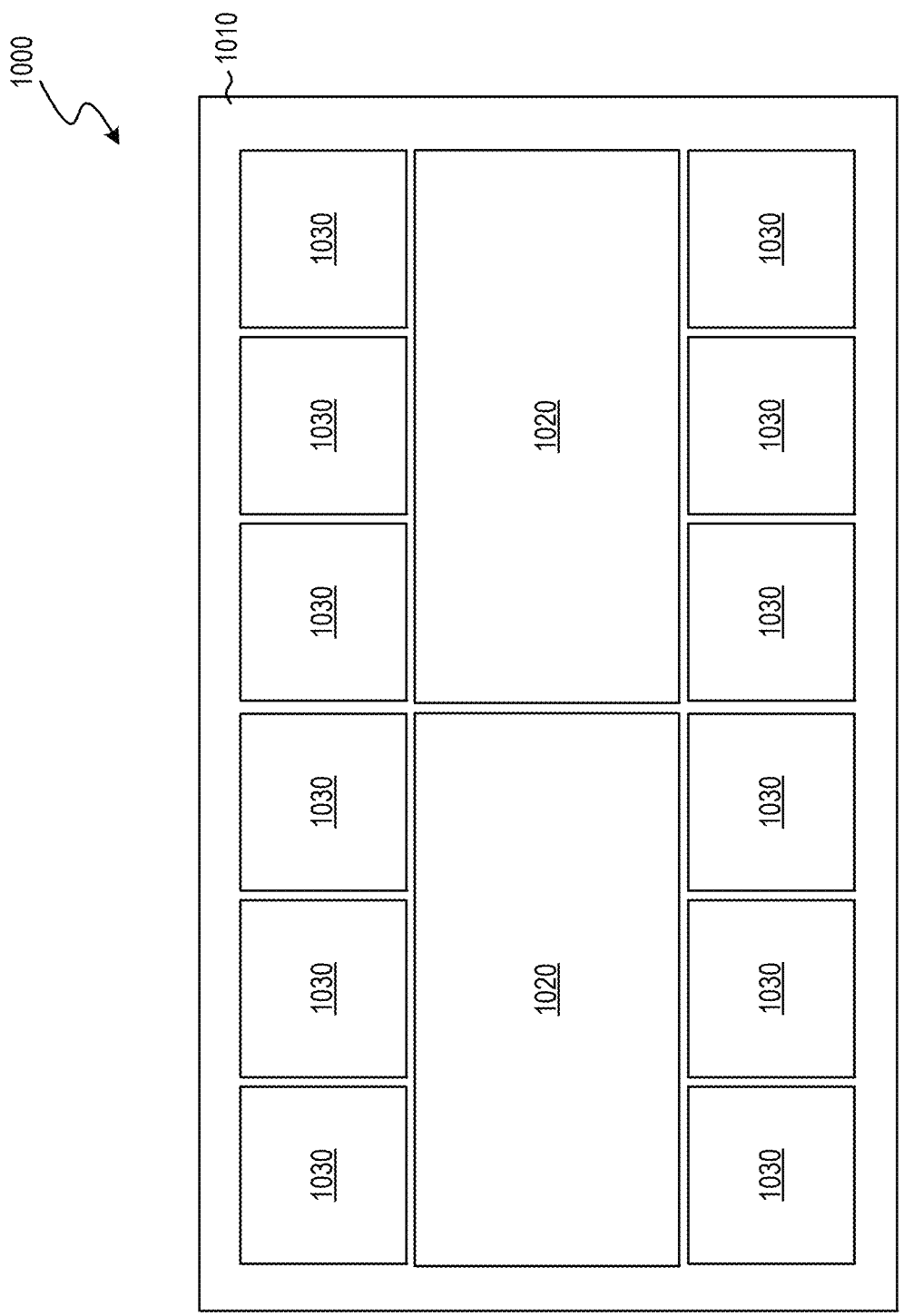
FIGS. 10A-10C are partially schematic top views of a system-in-package device configured in accordance with embodiments of the present technology.
Figure 10B:
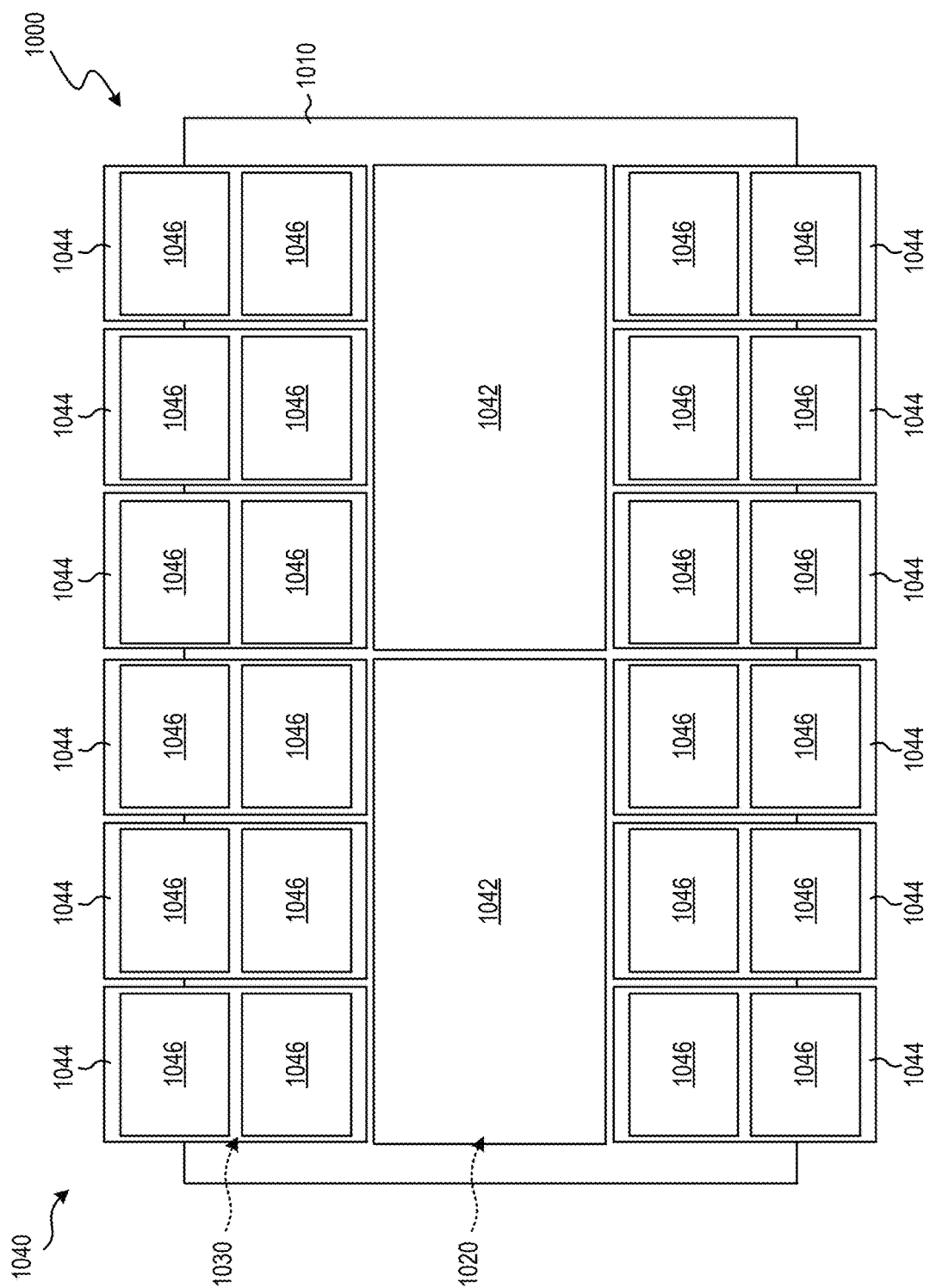
Figure 10C:
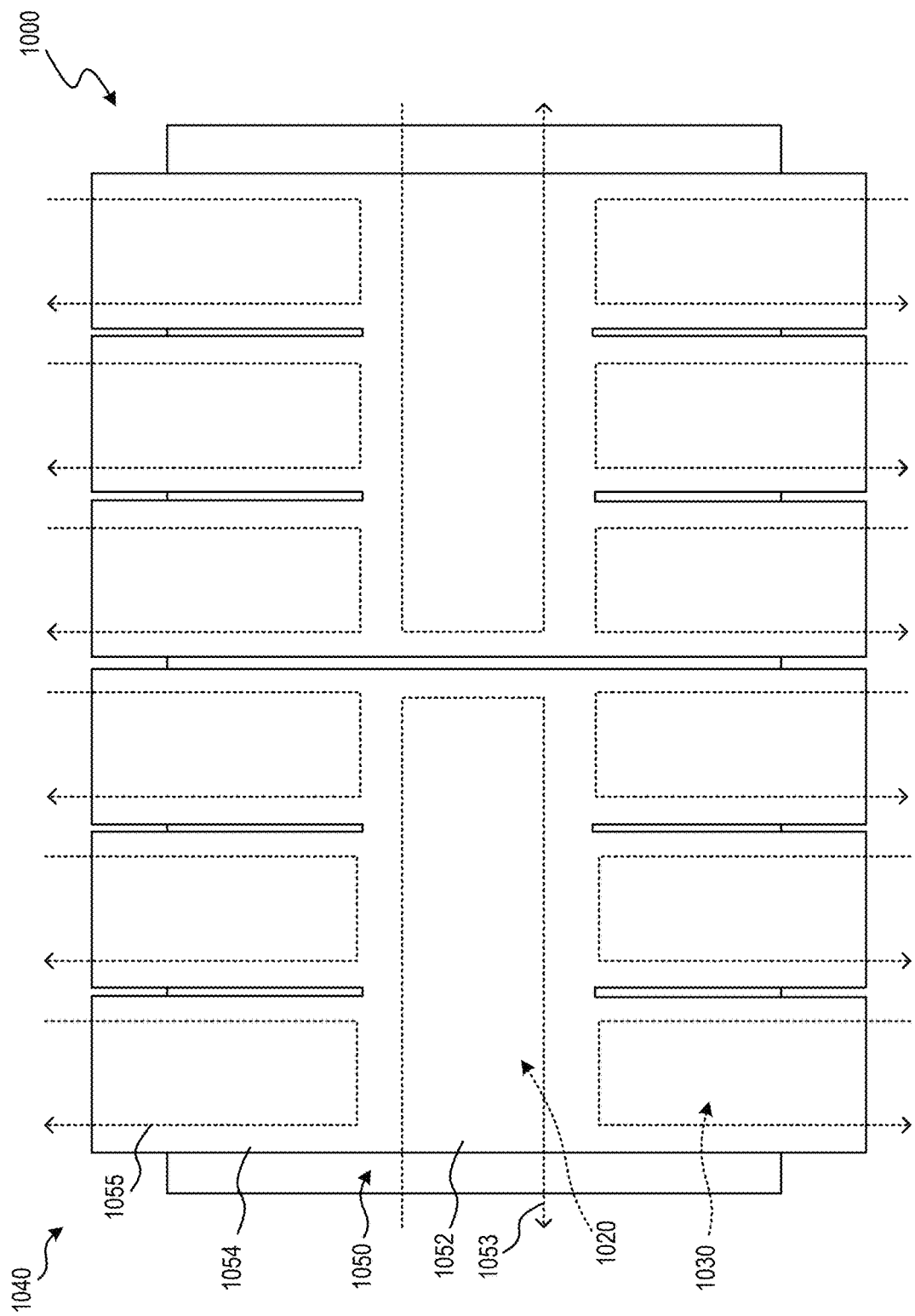

FIGS. 10A-10C are partially schematic top views of a SiP device 1000 configured in accordance with embodiments of the present technology. As illustrated in FIG. 10A, the SiP device 1000 is generally similar to the SiP devices discussed above with reference to FIGS. 7 and 8. For example, the SiP device 1000 includes a base substrate 1010, as well as one or more processing devices 1020 (two illustrated in FIG. 10A) and one or more HBM devices 1030 (twelve illustrated in FIG. 10A) that are each integrated with the base substrate 1010. Further, as illustrated schematically in FIGS. 10B and 10C, the SiP device 1000 can include a package cooling device 1040 that is positioned over and thermally coupled to each of the processing devices 1020 and each of the HBM devices 1030.

As best illustrated in FIG. 10B, similar to the discussion above with reference to FIG. 9, the package cooling device 1040 can include a first heat spreader 1042 individually corresponding to each of the processing devices 1020, as well as a second heat spreader 1044 individually corresponding to each of the HBM devices 1030. In the illustrated embodiments, the second heat spreaders 1044 extend beyond a longitudinal footprint of the base substrate 1010. In other embodiments, however, the second heat spreaders 1044 are contained fully within the longitudinal footprint of the base substrate 1010 (and therefore an existing longitudinal footprint for the SiP device 1000). As further illustrated in FIG. 10B, the package cooling device 1040 further includes one or more TEC devices 1046 individually corresponding to each of the HBM devices 1030 (two for each of the HBM devices 1030 in the illustrated embodiments).

Still further, as best illustrated in FIG. 10C, the package cooling device 1040 can further include one or more heat exchangers 1050 (two illustrated in FIG. 10C, one corresponding to each of the processing devices 1020 of FIG. 10A) stacked over the first heat spreaders 1042, the second heat spreaders 1044, and/or the TEC devices 1046. The heat exchangers 1050 can include a first region 1052 (e.g., a core region) corresponding to the processing devices 1020 as well as one or more second regions 1054 (e.g., peripheral regions) corresponding to the HBM devices 1030 (six per heat exchanger 1050 illustrated in FIG. 10C-one for each of the HBM devices 1030). Each of the first regions 1052 includes a first flow chamber 1053. The first flow chamber 1053 can be generally similar (or identical) to the fluid paths discussed above with reference to FIG. 9 to circulate a fluid and provide cooling to the first heat spreaders 1042 (FIG. 10B) and therefore to the processing devices 1020. Similarly, each of the second regions 1054 includes a second flow chamber 1055. The second flow chambers 1055 can be generally similar (or identical) to the fluid paths discussed above with reference to FIG. 9 to circulate a fluid and provide cooling to the TEC devices 1046 (FIG. 10B) and therefore to the second heat spreaders 1044 and to the HBM devices 1030.

Although not illustrated in the elevations of the top views in FIGS. 10B and 10C, it will be understood that, similar to the embodiments discussed above with reference to FIG. 9, the first heat spreaders 1042 (FIG. 10B) can include an upper portion that extends over each of the second heat spreaders 1044 and each of the TEC devices 1046. In these embodiments, the TEC devices 1046 can provide active cooling to the second heat spreaders 1044 while expelling heat into the first heat spreaders. However, the technology disclosed herein is not so limited. For example, in some embodiments, the TEC devices 1046 are in direct thermal contact with the heat exchanger 1050 to expel heat directly into the heat exchanger. Additionally, or alternatively, the package cooling device 1040 can include one or more TEC devices between the first heat spreader 1042 and the heat exchanger 1050 to provide active cooling to the first heat spreader 1042 and therefore to the processing devices 1020.

Further, although the second heat spreaders 1044 and the second regions 1054 of the heat exchanger are illustrated as isolated fingers, it will be understood that the technology disclosed herein is not so limited. For example, the second heat spreaders 1044 can be continuous across each of the HBM devices 1030 on one side of the processing devices 1020. In another example, the second regions 1054 can be continuous across the peripheral portions of the heat exchanger 1050 (e.g., omitting the gaps between fingers of the second regions 1054). In some such embodiments, the second regions 1054 include a single second flow chamber 1055. In other such embodiments, the second regions 1054 include one of the second flow chambers 1055 for each of the HBM devices 1030. Further, in some embodiments, the package cooling device 1040 includes a single, continuous heat exchanger 1050 for each of the processing devices 1020.

Figure 11:
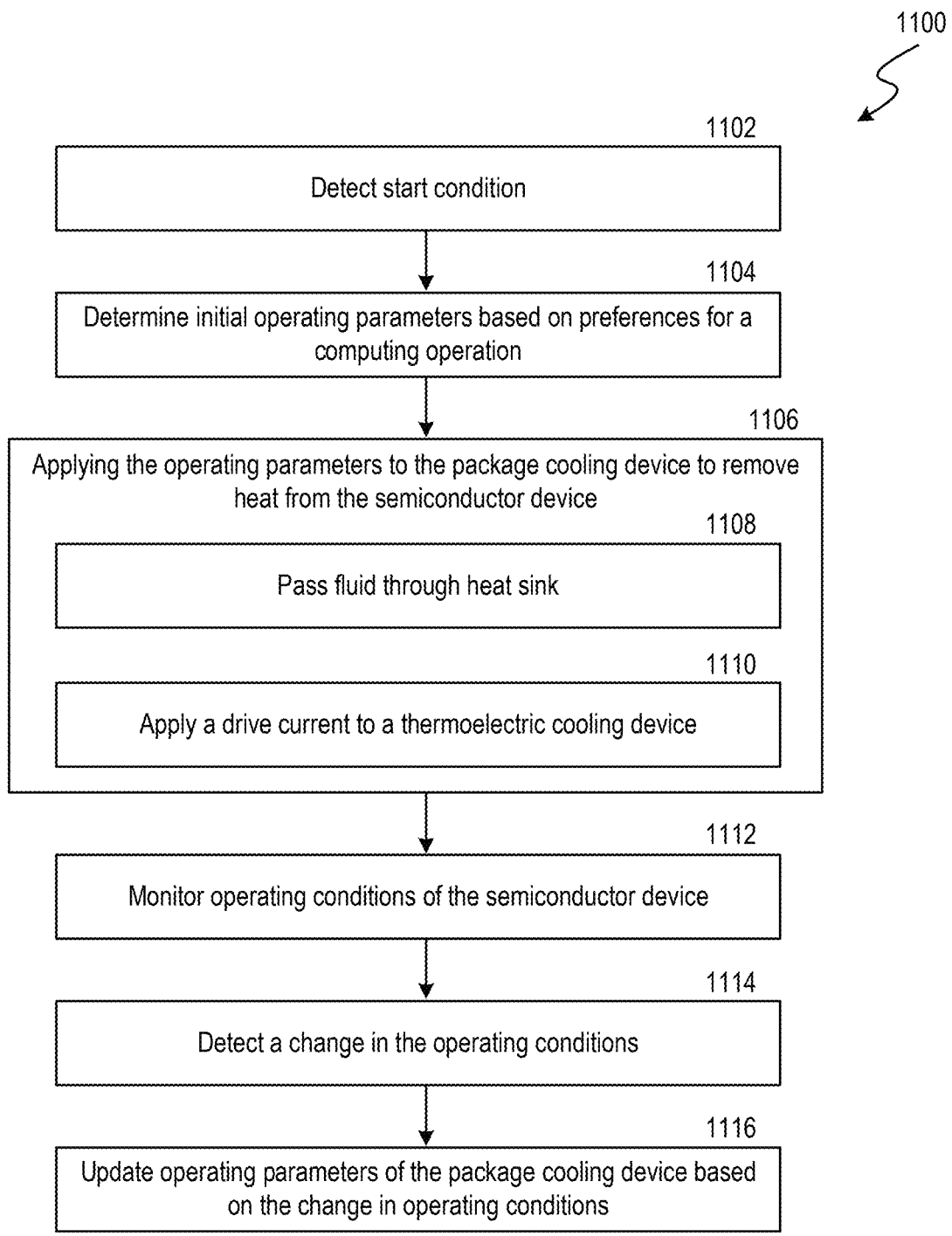
FIG. 11 is a flow diagram of a process for operating a package cooling device in accordance with embodiments of the present technology.

FIG. 11 is a flow diagram of a process 1100 for operating a package cooling device in accordance with embodiments of the present technology. More specifically, the process 1100 can be executed to control the temperature of various components of a semiconductor device (e.g., a SiP device, a stacked semiconductor device, an ASIC, and/or the like) and/or another computing device. As a result, the process 1100 can help maintain the computing efficiency and/or computational power of the semiconductor device. In various embodiments, the process 1100 can control a package cooling device of the type discussed above with reference to FIGS. 8-10C. Further, the process 1100 can be executed by a controller of the package cooling device, such as the processing device on a SiP and/or a peripheral controller. Still further, although discussed below primarily in the context of being implemented by a single processing component, one of skill in the art will understand that the process 1100 is not so limited. Instead, the process 1100 can be implemented by two or more processing components working in conjunction. Purely by way of example, the process 1100 can be split between the processing device on the SiP and the peripheral controller.

The process 1100 begins at block 1102 by detecting a start condition. The start condition can be a temperature at various surfaces of the semiconductor device (e.g., an outer surface of a package, an upper surface of a processing device in a SiP device, an upper surface of an HBM device in a SiP, a temperature at a lower surface of a base substrate, and/or the like), a temperature within various components of the semiconductor device (e.g., within the HBM device of a SiP), an indication of a workload and/or computational load applied to the semiconductor device (e.g., a computational assignment assigned to a processing device in a SiP device, read/write commands sent to an HBM device, and/or the like), an indication of a workload being assigned to the semiconductor device (e.g., when a datacenter scheduler and/or other peripheral device assigns a workload to a SiP device and/or chiplet), a repeating start time (e.g., a time associated with repeating computational loads applied to the semiconductor device), and/or the like. As a result, the start condition can be detected based on measurements from one or more sensors in contact with and/or integrated with the semiconductor device, signals from a peripheral controller (e.g., when assigning a computational load), and/or the like.

At block 1104, the process 1100 includes determining initial operating parameters based on preferences for a computing operation. The preferences can include indications on requirements for results from the computing operation (e.g., whether the results are required in real time), preferences for energy consumption, preferences for computational power and/or speed, and/or the like. For example, a first computing operation can require results from the computing operation in real time without a preference for conserving energy. As a result, the process 1100 can select operating parameters for the package cooling device to remove large volumes of heat to preserve a maximum computational power in the SiP device, irrespective of the energy requirements for the package cooling device. In another example, a second computing operation can have no requirements on the timing and a preference for reducing overall power consumption. In this example, the process 1100 can select operating parameters for the package cooling device that are expected to balance the power required to operate the package cooling device with increased power consumption (e.g., for increased refresh rates and/or throttled operation) due to heat build-up.

In some embodiments, the initial operating parameters are determined by retrieving initial operating parameters from a look-up-table (e.g., storing standard initial operating parameters for each of a variety of preferences; storing previous operating parameters used for each of the variety of preferences; and/or the like). In some embodiments, determining the initial parameters comprises predicting an amount of heat that will be generated in the semiconductor device (e.g., based on a predicted number of read/write operations, a predicted complexity of a computing operation, a predicted number of refreshes based on recent performance of the semiconductor device, and/or the like) and determining operating parameters predicted to transport a corresponding amount of heat away from the semiconductor device. In some embodiments, determining the initial operating parameters includes determining which components of the semiconductor device will be utilized during the computing operation. For example, for a SiP device that includes a plurality of HBM devices, the process 1100 at block 1104 can include determining which of the plurality of HBM devices will be used during the computing operation and typical operating conditions for the HBM devices that will be used (e.g., how much heat the HBM devices typically generate, average refresh rates for the HBM devices at different temperatures and/or different computational loads, and/or the like). The process can then determine which fluid paths in a heat exchanger to operate (e.g., which of the fluid paths 934 in the heat exchanger 930 of FIG. 9), flow rates through each of the fluid paths, temperature of an incoming fluid in the fluid paths, which TEC devices to operate (e.g., which of the TEC devices 842 of FIG. 8, which of the TEC devices 920 of FIG. 9, and/or the like), what drive current to provide to the TEC devices, and/or the like. In some embodiments, the initial parameters are determined from control signals (and/or response signals received after a prompt) from the datacenter scheduler and/or other peripheral controller. In such embodiments, the initial parameters can be specific to an incoming workload that the datacenter scheduler has assigned to a SiP device and/or chiplet.

At block 1106, the process 1100 includes applying the initial operating parameters to the package cooling device to remove heat from the semiconductor device. For example, the process 1100 can include passing a fluid through a heat sink in the package cooling device (e.g., the heat exchanger 844 of FIG. 8, the heat exchanger 930 of FIG. 9, and/or the like) at sub-block 1108 and applying a drive current to a thermoelectric cooling device in the package cooling device (e.g., the TEC devices 842 of FIG. 8, the TEC devices 920 of FIG. 9, and/or the like) at sub-block 1110. As discussed above, the operating parameters can be configured to maximize computational power and/or computational efficiency in the semiconductor device (e.g., by maximizing heat transportation away from the semiconductor device (e.g., to deliver maximum active cooling)), maximize energy efficiency in the semiconductor device (e.g., by maximizing a ratio between heat flux and the amount energy consumed by the package cooling device, maximizing a ratio between heat flux and the amount of energy consumed by the semiconductor device overall, minimizing energy consumption for a computing operation, and/or the like), and/or the like.

While the computing operation is executed, operating conditions (e.g., heat, computational power, computational efficiency, computational loads, required throttling, and/or the like) can vary over time. Changes in the operating conditions, in turn, can require changes to the operating parameters of the package cooling device to meet the preferences for the computing operation. Purely by way of example, an initial set of operating parameters can be sufficient to maintain maximum computational power at the start of a complex computing operation. During the operation, however, heat can slowly build up. Additionally, or alternatively, the complexity of the operation can ramp up, thereby generating more heat. As a result, the initial operating parameters can become insufficient to maintain the requisite computational power. Accordingly, the process 1100 can include steps to help the package cooling device adapt to changes over time.

For example, at block 1112, the process 1100 includes monitoring various operating conditions of the semiconductor device. Further, at block 1114, the process 1100 includes detecting a change in the operating conditions. As discussed above, the operating conditions can include computational power of components of the semiconductor device, computational efficiency of the components of the semiconductor device (e.g., how many refreshes per clock cycle, computations per unit time, computations per unit energy, and/or the like), a temperature of the semiconductor device (and/or specific components therein), computational loads on the semiconductor device, whether there is any throttling imposed on the semiconductor device, and/or the like. The change can be detected when any of the operating conditions above changes over time and/or departs from a predetermined acceptable range (e.g., when the computational power drops below a predetermined threshold, where the predetermined threshold can be based on the preferences for the computing operation).

At block 1116, the process 1100 includes updating the operating parameters of the package cooling device based on the detected change in the operating conditions. For example, the updates can ramp up the amount of heat that the package cooling device transports away from the semiconductor device (e.g., ramping up the amount of active cooling) to maintain and/or restore a desired computational power. In another example, the updates can adjust a ratio between heat flux and the amount of energy consumed by the package cooling device. In some embodiments, the adjustments are specific to sub-components of the package cooling device. For example, the adjustments can include varying a fluid flow rate through any individual one of the fluid paths 934 in the heat exchanger 930 of FIG. 9 (and/or a temperature of the incoming fluid) to increase heat flux away from a specific region of the heat exchanger 930. In another example, the adjustments can include varying a drive current applied to any individual one of the TEC devices 920 of FIG. 9 to alter a temperature gradient between the first heat spreader 912 and a corresponding one of the second and third heat spreaders 914, 916 (e.g., thereby adjusting the second temperature $T_2$).

Similar to the discussion above, the updates to the operating parameters can be determined based on retrieving information from a look-up-table (or other suitable memory storage), retrieving operating parameters associated with similar previous operating conditions in the semiconductor device, and/or by determining (e.g., calculating, predicting, and/or the like) how changes to the operating parameters will impact heat flow out of the semiconductor device, performance of the semiconductor device, and/or overall energy consumption. Once the updates are determined and made, the process 1100 can store the updates for use in future operations and/or future update determinations. Further, once the updates are made, the process 1100 can return to block 1112 to continue monitoring the operating conditions of the semiconductor device until the computing operation is complete.

Figure 12:
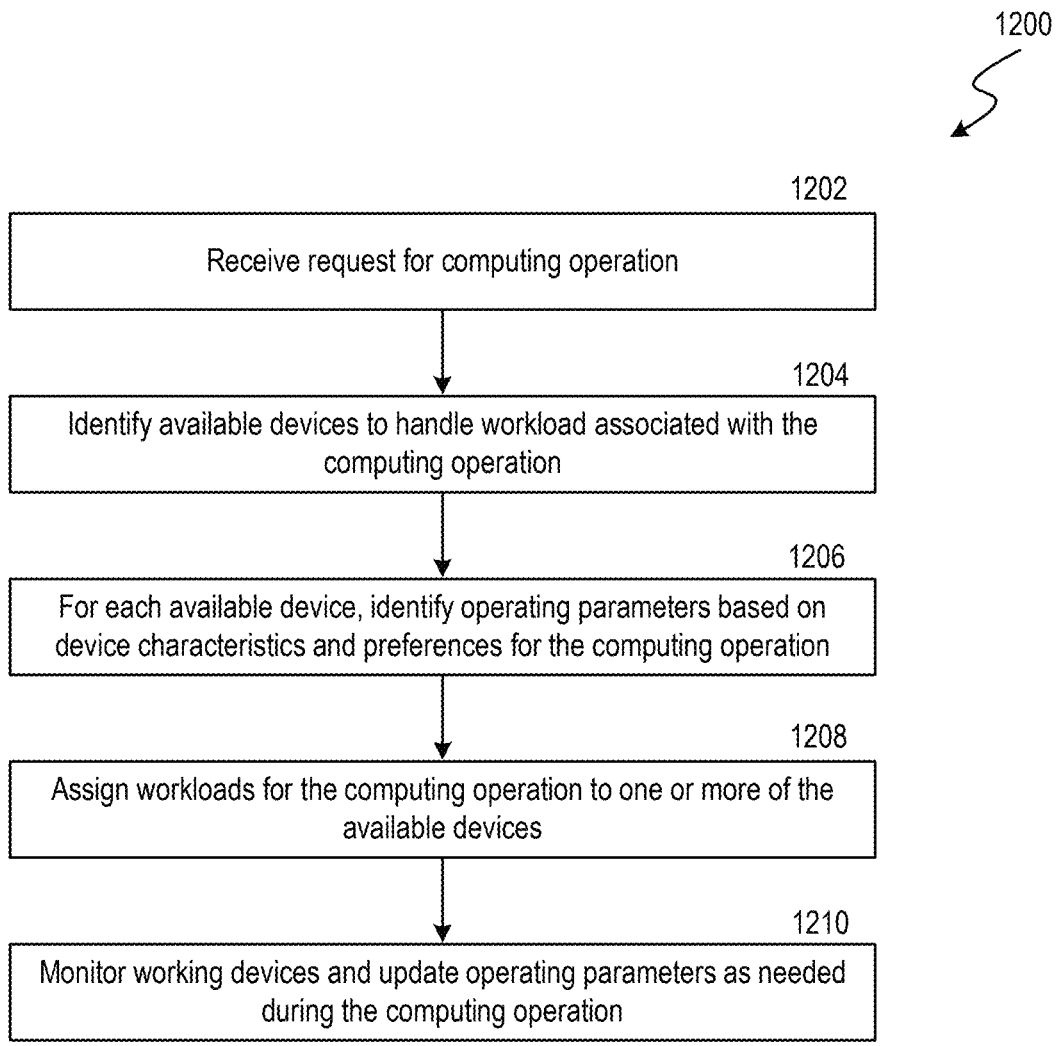
FIG. 12 is a flow diagram of a process for operating a system of computing devices in accordance with embodiments of the present technology.

FIG. 12 is a flow diagram of a process 1200 for operating a system of processing units (e.g., a datacenter) in accordance with embodiments of the present technology. More specifically, the process 1200 can be executed to control the temperature of various components of the system (e.g., individual chiplets, components of a SiP device, individual stacked semiconductor devices, and/or the like). As a result, the process 1200 can help maintain the computing efficiency and/or computational power of components of the system and/or the system overall. In a specific, non-limiting example, the process 1200 can control a plurality of package cooling devices of the type discussed above with reference to FIGS. 8-10C that are each individually coupled to a corresponding SiP device. Further, the process 1200 can be executed by a controller of the system, such as a datacenter scheduler, computing system controller (e.g., a supervisor module), and/or another suitable controller. Still further, although discussed below primarily in the context of being implemented by a single processing component, one of skill in the art will understand that the process 1200 is not so limited. Instead, the process 1200 can be implemented by two or more processing components working in conjunction. Purely by way of example, the process 1200 can be split between processing devices specific to each SiP and the datacenter scheduler. In another example, the process 1200 can be split between a controller responsible for a rack of processing devices in a datacenter and the datacenter scheduler.

The process 1200 begins at block 1202 by receiving a request for a computing operation. The request can be based on inputs and/or requests from a user to perform the computing operation. In various embodiments, the request is received via a network connection (e.g., at a physical datacenter supporting a cloud computing system), an interface of an operating system (e.g., for a local computing system), a local area network (e.g., for servers support a local computing system), at computing system scheduler from another suitable controller; and/or the like. Further, in various embodiments, the request can include an indication of the computing operation and/or resources needed for computing operation (e.g., an estimate of how many processing devices will be necessary, memory needed for the computing operation, and/or the like). Additionally, or alternatively, the request can include timing requirements for the computing operation and/or a priority of the computing operation, such as whether results of the computing operation are required in real time. The timing requirements (and/or priority), in turn, can impact how much cooling power is provided to components of the computing system during the computing operation. Additionally, or alternatively, the request can include energy consumption requirements for the computing operation, such as whether the computing operation should be executed to minimize energy consumption for the computing system.

At block 1204, the process 1200 includes identifying available devices (e.g., SiP devices, ASICs, chiplets, processing cores, and/or the like) to handle workloads associated with the computing operation. The process 1200 at block 1204 can communicating with a system scheduler, checking an activity log, sending one or more availability signals, and/or the like. At block 1206, the process 1200 includes, for each available device, identifying operating parameters for the device based on device characteristics (e.g., known heat generation characteristics, TDP, computational power, computational speed, temperature limits and/or throttling thresholds, and/or the like) and preferences for the computing operation (e.g., real-time operation, energy saving, and/or the like). The operating parameters can include energy consumption, computational power, computational speed, input energy for package cooling devices (e.g., for TEC devices in the package cooling devices, pump speeds to cycle a cooling fluid through a heat exchanger, and/or the like), pump speed for a fluid cycling system, and/or the like. By retrieving the operating parameters for each of the available devices, the process 1200 can choose subsets of the available devices that best meet the needs and/or preferences for the computing operation.

At block 1208, the process 1200 includes assigning workloads for the computing operation to one or more of the available devices. In some embodiments, the entire computing operation is assigned to a single available device (e.g., a single SiP device in a server; a single server; and/or the like). In some embodiments, the computing operation is split between a plurality of the available devices. The assignment can be based on which of the available devices meet requirements and/or preferences for the computing operation, which subsets maintain maximum availability for future requests, which subsets minimize energy consumption, which subsets maintain relative milage in the available devices, a set hierarchy of the available devices, and/or the like. The assignment causes the associated devices to begin executing the requested computing operation.

At block 1210, the process 1200 includes monitoring the working devices and updating operating parameters, as needed, during the computing operation. For example, the process 1200 at block 1210 can be generally similar to the process 1100 discussed above with reference to FIG. 11. For example, when the process 1200 detects a change in the operating conditions at any of the devices associated with the computing operation (e.g., an increase in temperature), the process 1200 can include updating operating parameters for the individual device. Additionally, or alternatively, the process 1200 can address changes in the operating conditions at one or more of the devices by reassigning portions of the workload and/or ramp operating parameters for the computing system more broadly. Purely by way of example, if one of the assigned devices begins to overheat, the process 1200 at block 1210 can reassign portions of the workload to one or more other devices and/or increase the cooling provided to the system overall (e.g., to help maintain the temperature of every device in the system).

EXAMPLES

The present technology is illustrated, for example, according to various aspects described below. Various examples of aspects of the present technology are described as numbered examples (1, 2, 3, etc.) for convenience. These are provided as examples and do not limit the present technology. It is noted that any of the dependent examples can be combined in any suitable manner, and placed into a respective independent example. The other examples can be presented in a similar manner.

1. A system-in-package device, comprising:
   a base substrate;
   a processing device integrated with the base substrate;
   a high-bandwidth memory device integrated with the base substrate and electrically coupled to the processing device through the base substrate; and
   a package cooling device thermally coupled to the processing device and the high-bandwidth memory device, the package cooling device comprising:
     a first heat spreader thermally coupled to an upper surface of the processing device;
     a second heat spreader thermally coupled to an upper surface of the high-bandwidth memory device;
     a thermoelectric cooling device positioned between and thermally coupled to a portion of the first heat spreader and the second heat spreader, wherein the thermoelectric cooling device is positioned to transport heat from the second heat spreader to the first heat spreader; and
     a heat exchanger thermally coupled to the first heat spreader, wherein the heat exchanger is positioned to absorb heat from the first heat spreader.

2. The system-in-package device of example 1 wherein:
   the high-bandwidth memory device is a first high-bandwidth memory device integrated with the base substrate adjacent to a first side of the processing device;
   the thermoelectric cooling device is a first thermoelectric cooling device positioned between a first portion of the first heat spreader and the second heat spreader;

the system-in-package device further comprises a second high-bandwidth memory device integrated with the base substrate adjacent to a second side of the processing device and electrically coupled to the processing device through the base substrate; and the package cooling device further comprises:
a third heat spreader thermally coupled to an upper surface of the second high-bandwidth memory device; and
a second thermoelectric cooling device positioned between and thermally coupled to a second portion of the first heat spreader and the third heat spreader, wherein the second thermoelectric cooling device is positioned to transport heat from the third heat spreader to the first heat spreader.

3. The system-in-package device of example 2 wherein the first thermoelectric cooling device is operable independent from the second thermoelectric cooling device.

4. The system-in-package device of any of examples 2 and 3 wherein the heat exchanger includes:
a first fluid path vertically aligned with a direct thermal path from the processing device to the heat exchanger through the heat exchanger;
a second fluid path vertically aligned with the first portion of the first heat spreader, wherein the second fluid path is fluidly coupled to a peripheral cooling system independent from the first fluid path; and
a third fluid path vertically aligned with the second portion of the first heat spreader, wherein the third fluid path is fluidly coupled to a peripheral cooling system independent from the first fluid path and the second fluid path.

5. The system-in-package device of any of examples 1-4 wherein at least a portion of the package cooling device extends beyond a longitudinal footprint of the base substrate.

6. The system-in-package device of any of examples 1-5 wherein the heat exchanger includes a fluid path between an inlet and an outlet, wherein the inlet and the outlet are fluidly couplable to a peripheral cooling system to circulate a cooling fluid through the heat exchanger.

7. The system-in-package device of any of examples 1-6 wherein the portion of the first heat spreader thermally coupled to the thermoelectric cooling device is a second portion, and wherein the heat exchanger includes:
a first fluid path vertically aligned with a first portion of the first heat spreader, wherein the first portion corresponds to a direct thermal path from the processing device to the heat exchanger through the heat exchanger; and
a second fluid path vertically aligned with the second portion of the first heat spreader, wherein the second fluid path is fluidly coupled to a peripheral cooling system independent from the first fluid path.

8. The system-in-package device of any of examples 1-7 wherein the thermoelectric cooling device is a first thermoelectric cooling device, and wherein the package cooling device further comprises a second thermoelectric cooling device positioned between and thermally coupled to the portion of the first heat spreader and the second heat spreader, wherein the second thermoelectric cooling device is positioned to transport heat from the second heat spreader to the first heat spreader.

9. The system-in-package device of any of examples 1-8 wherein the heat exchanger is configured to maintain the portion of the first heat spreader at a first temperature, and wherein the thermoelectric cooling device is configured to create a temperature differential to maintain the second heat spreader at a second temperature lower than the first temperature.

10. A package cooling device for a semiconductor device, the package cooling device comprising:
a first heat spreader thermally couplable to an upper surface of a processing device;
a second heat spreader thermally couplable to an upper surface of a high-bandwidth memory device, wherein the second heat spreader is positioned at least partially beneath a portion of the first heat spreader and spaced apart from the first heat spreader by a gap;
a thermoelectric cooling device positioned in the gap, wherein a first side of the thermoelectric cooling device is thermally coupled to the first heat spreader and a second side of the thermoelectric cooling device is thermally coupled to the second heat spreader; and
a heat exchanger carried by the first heat spreader, wherein the heat exchanger is thermally coupled to the first heat spreader to absorb heat from the first heat spreader.

11. The package cooling device of example 10 wherein the thermoelectric cooling device is positioned to transport heat from the second heat spreader to the first heat spreader when a drive current is provided to the thermoelectric cooling device.

12. The package cooling device of any of examples 10 and 11 wherein the second heat spreader is positioned fully within a footprint of the first heat spreader.

13. The package cooling device of any of examples 10-12 wherein the heat exchanger includes a plurality of independent fluid paths, each of the plurality of independent fluid paths fluidly couplable to a peripheral cooling system to control a temperature of the first heat spreader.

14. The package cooling device of example 13 wherein the temperature of the first heat spreader is a first temperature, wherein the thermoelectric cooling device is positioned to control a second temperature of the second heat spreader at a gradient with respect to the first temperature when a drive current is provided to the thermoelectric cooling device.

15. The package cooling device of any of examples 10-14 wherein:
the portion of the first heat spreader includes a central region, a first peripheral region adjacent to a first side of the central region, and a second peripheral region adjacent to a second side of the central region;
the second heat spreader is positioned at least partially beneath the first peripheral region, wherein the second heat spreader is thermally couplable to an upper surface of a first high-bandwidth memory device, and wherein the gap is a first gap;
the thermoelectric cooling device is a first thermoelectric cooling device; and the package cooling device further comprises:
a third heat spreader thermally couplable to an upper surface of a second high-bandwidth memory device, wherein the third heat spreader is positioned at least partially beneath the second peripheral region of the first heat spreader and spaced apart from the first heat spreader by a second gap; and
a second thermoelectric cooling device positioned in the second gap, wherein a first side of the second thermoelectric cooling device is thermally coupled to the first heat spreader and a second side of the thermoelectric cooling device is thermally coupled to the third heat spreader.

16. The package cooling device of example 15 wherein the heat exchanger comprises:
  a first fluid path vertically aligned with the central region of the first heat spreader;
  a second fluid path vertically aligned with the first peripheral region of the first heat spreader, wherein the second fluid path is operable independent from the first fluid path; and
  a third fluid path vertically aligned with the second peripheral region of the first heat spreader, wherein the third fluid path is operable independent from the first fluid path and the second fluid path.

17. A method for operating a package cooling device to preserve computational power of a semiconductor device during a computing operation, the method comprising:
  detecting a start condition associated with a start of the computing operation;
  determining initial operating parameters for the package cooling device to preserve the computational power of the semiconductor device, wherein the initial operating parameters comprise:
    an initial flow rate for a cooling fluid through one or more fluid flow paths in a heat exchanger of the package cooling device; and
    a drive current for each of one or more thermoelectric cooling devices in the package cooling device; and
  applying the initial operating parameters to the package cooling device to remove heat from the semiconductor device.

18. The method of example 17 wherein the semiconductor device is a system-in-package device having a plurality of high-bandwidth memory devices, and wherein the initial operating parameters depend at least partially on which of the plurality of high-bandwidth memory devices are involved in the computing operation.

19. The method of any of examples 17 and 18, further comprising:
  detecting a change in one or more operating conditions of the semiconductor device during the computing operation; and
  updating one or more of the initial operating parameters of the package cooling device based on the detected change in the one or more operating conditions.

20. The method of example 19 wherein the detected change comprises a measurement of the computational power of the semiconductor device falling below a predetermined threshold for the computing operation.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/of" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "generally," "approximately," and "about" are used herein to mean within at least within 10% of a given value or limit. Purely by way of example, an approximate ratio means within 10% of the given ratio.

Several implementations of the disclosed technology are described above in reference to the figures. The computing devices on which the described technology may be implemented can include one or more central processing units, memory, input devices (e.g., keyboard and pointing devices), output devices (e.g., display devices), storage devices (e.g., disk drives), and network devices (e.g., network interfaces). The memory and storage devices are computer-readable storage media that can store instructions that implement at least portions of the described technology. In addition, the data structures and message structures can be stored or transmitted via a data transmission medium, such as a signal on a communications link. Various communications links can be used, such as the Internet, a local area network, a wide area network, or a point-to-point dial-up connection. Thus, computer-readable media can comprise computer-readable storage media (e.g., "non-transitory" media) and computer-readable transmission media.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. In a specific, non-limiting example discussed above, a package cooling device (and/or an associated system) according to the embodiments of FIGS. 8-12 can be combined with a cooling system according to the embodiments of FIGS. 1-6. In such embodiments, the package cooling device can directly control the temperature of various components of an electric device (e.g., a SiP device) while the cooling system supplies the heat exchanger with a cooled fluid support the temperature control.

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A system-in-package device, comprising:
  a base substrate;
  a processing device integrated with the base substrate;
  a high-bandwidth memory device integrated with the base substrate and electrically coupled to the processing device through the base substrate; and
  a package cooling device thermally coupled to the processing device and the high-bandwidth memory device, the package cooling device comprising:
    a first heat spreader thermally coupled to an upper surface of the processing device;
    a second heat spreader thermally coupled to an upper surface of the high-bandwidth memory device;

a thermoelectric cooling device positioned between and thermally coupled to a portion of the first heat spreader and the second heat spreader, wherein the thermoelectric cooling device is positioned to transport heat from the second heat spreader to the first heat spreader; and a heat exchanger thermally coupled to the first heat spreader, wherein the heat exchanger is positioned to absorb heat from the first heat spreader; wherein the high-bandwidth memory device is a first high-bandwidth memory device integrated with the base substrate adjacent to a first side of the processing device;

the thermoelectric cooling device is a first thermoelectric cooling device positioned between a first portion of the first heat spreader and the second heat spreader;

the system-in-package device further comprises a second high-bandwidth memory device integrated with the base substrate adjacent to a second side of the processing device and electrically coupled to the processing device through the base substrate; and the package cooling device further comprises:

a third heat spreader thermally coupled to an upper surface of the second high-bandwidth memory device; and a second thermoelectric cooling device positioned between and thermally coupled to a second portion of the first heat spreader and the third heat spreader, wherein the second thermoelectric cooling device is positioned to transport heat from the third heat spreader to the first heat spreader.

2. The system-in-package device of claim 1 wherein the first thermoelectric cooling device is operable independent from the second thermoelectric cooling device.

3. The system-in-package device of claim 1 wherein the heat exchanger includes:

a first fluid path vertically aligned with a direct thermal path from the processing device to the heat exchanger through the heat exchanger;

a second fluid path vertically aligned with the first portion of the first heat spreader, wherein the second fluid path is fluidly coupled to a peripheral cooling system independent from the first fluid path; and a third fluid path vertically aligned with the second portion of the first heat spreader, wherein the third fluid path is fluidly coupled to a peripheral cooling system independent from the first fluid path and the second fluid path.

4. The system-in-package device of claim 1 wherein at least a portion of the package cooling device extends beyond a longitudinal footprint of the base substrate.

5. The system-in-package device of claim 1 wherein the heat exchanger includes a fluid path between an inlet and an outlet, wherein the inlet and the outlet are fluidly couplable to a peripheral cooling system to circulate a cooling fluid through the heat exchanger.

6. The system-in-package device of claim 1 wherein the portion of the first heat spreader thermally coupled to the thermoelectric cooling device is a second portion, and wherein the heat exchanger includes:

a first fluid path vertically aligned with a first portion of the first heat spreader, wherein the first portion corresponds to a direct thermal path from the processing device to the heat exchanger through the heat exchanger; and a second fluid path vertically aligned with the second portion of the first heat spreader, wherein the second fluid path is fluidly coupled to a peripheral cooling system independent from the first fluid path.

7. The system-in-package device of claim 1 wherein the thermoelectric cooling device is a first thermoelectric cooling device, and wherein the package cooling device further comprises a second thermoelectric cooling device positioned between and thermally coupled to the portion of the first heat spreader and the second heat spreader, wherein the second thermoelectric cooling device is positioned to transport heat from the second heat spreader to the first heat spreader.

8. The system-in-package device of claim 1 wherein the heat exchanger is configured to maintain the portion of the first heat spreader at a first temperature, and wherein the thermoelectric cooling device is configured to create a temperature differential to maintain the second heat spreader at a second temperature lower than the first temperature.

9. A package cooling device for a semiconductor device, the package cooling device comprising:

a first heat spreader thermally couplable to an upper surface of a processing device;

a second heat spreader thermally couplable to an upper surface of a high-bandwidth memory device, wherein the second heat spreader is positioned at least partially beneath a portion of the first heat spreader and spaced apart from the first heat spreader by a gap;

a thermoelectric cooling device positioned in the gap, wherein a first side of the thermoelectric cooling device is thermally coupled to the first heat spreader and a second side of the thermoelectric cooling device is thermally coupled to the second heat spreader; and a heat exchanger carried by the first heat spreader, wherein the heat exchanger is thermally coupled to the first heat spreader to absorb heat from the first heat spreader; further wherein the portion of the first heat spreader includes a central region, a first peripheral region adjacent to a first side of the central region, and a second peripheral region adjacent to a second side of the central region;

the second heat spreader is positioned at least partially beneath the first peripheral region, wherein the second heat spreader is thermally couplable to an upper surface of a first high-bandwidth memory device, and wherein the gap is a first gap;

the thermoelectric cooling device is a first thermoelectric cooling device; and the package cooling device further comprises:

a third heat spreader thermally couplable to an upper surface of a second high-bandwidth memory device, wherein the third heat spreader is positioned at least partially beneath the second peripheral region of the first heat spreader and spaced apart from the first heat spreader by a second gap; and a second thermoelectric cooling device positioned in the second gap, wherein a first side of the second thermoelectric cooling device is thermally coupled to the first heat spreader and a second side of the thermoelectric cooling device is thermally coupled to the third heat spreader.

10. The package cooling device of claim 9 wherein the thermoelectric cooling device is positioned to transport heat from the second heat spreader to the first heat spreader when a drive current is provided to the thermoelectric cooling device.

11. The package cooling device of claim 9 wherein the second heat spreader is positioned fully within a footprint of the first heat spreader.

12. The package cooling device of claim 9 wherein the heat exchanger includes a plurality of independent fluid paths, each of the plurality of independent fluid paths fluidly couplable to a peripheral cooling system to control a temperature of the first heat spreader.

13. The package cooling device of claim 12 wherein the temperature of the first heat spreader is a first temperature, wherein the thermoelectric cooling device is positioned to control a second temperature of the second heat spreader at a gradient with respect to the first temperature when a drive current is provided to the thermoelectric cooling device.

14. The package cooling device of claim 9 wherein the heat exchanger comprises:
- a first fluid path vertically aligned with the central region of the first heat spreader;
- a second fluid path vertically aligned with the first peripheral region of the first heat spreader, wherein the second fluid path is operable independent from the first fluid path; and
- a third fluid path vertically aligned with the second peripheral region of the first heat spreader, wherein the third fluid path is operable independent from the first fluid path and the second fluid path.

* * * * *